US011693262B1

(12) United States Patent
Smyth et al.

(10) Patent No.: US 11,693,262 B1
(45) Date of Patent: Jul. 4, 2023

(54) APPARATUSES AND METHODS FOR ACTUATION OF OPTICAL ELEMENTS

(71) Applicant: META PLATFORMS TECHNOLOGIES, LLC, Menlo Park, CA (US)

(72) Inventors: Katherine Marie Smyth, Seattle, WA (US); Andrew John Ouderkirk, Kirkland, WA (US); John Cooke, Bothell, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 149 days.

(21) Appl. No.: 17/149,116

(22) Filed: Jan. 14, 2021

Related U.S. Application Data

(63) Continuation of application No. 15/992,731, filed on May 30, 2018, now Pat. No. 10,928,656.

(60) Provisional application No. 62/646,900, filed on Mar. 22, 2018.

(51) Int. Cl.
| | |
|---|---|
| *G02C 7/02* | (2006.01) |
| *G02C 7/08* | (2006.01) |
| *G02B 27/01* | (2006.01) |
| *G02C 7/06* | (2006.01) |
| *G02B 7/04* | (2021.01) |
| *G02B 3/14* | (2006.01) |
| *G02B 7/02* | (2021.01) |

(Continued)

(52) U.S. Cl.
CPC ............ *G02C 7/085* (2013.01); *G02B 3/14* (2013.01); *G02B 7/023* (2013.01); *G02B 7/04* (2013.01); *G02B 7/09* (2013.01); *G02B 26/004* (2013.01); *G02B 27/0172* (2013.01); *G02B 27/0176* (2013.01); *G02B 27/0179* (2013.01); *G02C 7/06* (2013.01); *G02B 2027/0159* (2013.01); *G02B 2027/0178* (2013.01); *G02B 2027/0185* (2013.01)

(58) Field of Classification Search
CPC ...................................................... G02C 7/085
USPC ....................................... 351/159.34, 159.68
See application file for complete search history.

(56) References Cited

U.S. PATENT DOCUMENTS

| | | | |
|---|---|---|---|
| 60,109 | A | 11/1866 | Woodward |
| 3,571,555 | A | 3/1971 | Townes et al. |
| 3,797,922 | A | 3/1974 | Plummer |

(Continued)

FOREIGN PATENT DOCUMENTS

| | | | |
|---|---|---|---|
| KR | 10-2011-0107812 A | | 10/2011 |
| KR | 101675093 B1 | | 11/2016 |

(Continued)

OTHER PUBLICATIONS

U.S. Appl. No. 15/992,731, filed May 30, 2018.

(Continued)

*Primary Examiner* — Darryl J Collins
(74) *Attorney, Agent, or Firm* — Greenberg Traurig, LLP

(57) ABSTRACT

An apparatus having an asymmetric adjustable lens with a deformable optical element. The apparatus may also include one or more actuators coupled to a deformable element of the asymmetric adjustable lens in a direct-drive configuration such that (1) mechanical action of the one or more actuators applies force to the deformable optical element and (2) the force applied by the mechanical action of the one or more actuators changes an optical property of the asymmetric adjustable lens by deforming the deformable optical element. Various other devices, systems, and methods are also disclosed.

20 Claims, 14 Drawing Sheets

(51) Int. Cl.
*G02B 7/09* (2021.01)
*G02B 26/00* (2006.01)

(56) References Cited

U.S. PATENT DOCUMENTS

| | | | |
|---|---|---|---|
| 4,477,158 | A | 10/1984 | Pollock et al. |
| 5,154,862 | A | 10/1992 | Reagan et al. |
| 5,225,244 | A | 7/1993 | Aharoni et al. |
| 5,663,779 | A | 9/1997 | Karasawa |
| 5,956,183 | A | 9/1999 | Epstein et al. |
| 6,081,388 | A | 6/2000 | Widl |
| 6,420,441 | B1 | 7/2002 | Allen et al. |
| 6,918,670 | B2 | 7/2005 | Blum et al. |
| 7,008,054 | B1 | 3/2006 | Kurtin et al. |
| 7,118,219 | B2 | 10/2006 | Itagaki |
| 7,125,508 | B2 | 10/2006 | Ide et al. |
| 7,864,440 | B2 | 1/2011 | Berge |
| 7,866,816 | B2 | 1/2011 | Kurtin |
| 8,210,678 | B1 | 7/2012 | Farwig |
| 8,441,737 | B2 | 5/2013 | Buch et al. |
| 9,292,085 | B2 | 3/2016 | Bennett et al. |
| 10,187,568 | B1 | 1/2019 | Tran et al. |
| 10,409,089 | B2 | 9/2019 | Pugh et al. |
| 10,698,224 | B1 | 6/2020 | Cooke et al. |
| 10,754,145 | B1 | 8/2020 | Ouderkirk et al. |
| 10,881,287 | B1 | 1/2021 | Ouderkirk et al. |
| 10,928,558 | B1 | 2/2021 | Cooke et al. |
| 10,928,656 | B1 | 2/2021 | Smyth et al. |
| 10,962,791 | B1 | 3/2021 | Ouderkirk et al. |
| 11,011,739 | B1 | 5/2021 | Ouderkirk et al. |
| 11,048,075 | B1 | 6/2021 | Ouderkirk et al. |
| 2003/0003295 | A1 | 1/2003 | Dreher et al. |
| 2003/0054115 | A1 | 3/2003 | Albano et al. |
| 2003/0067245 | A1 | 4/2003 | Pelrine et al. |
| 2003/0083433 | A1 | 5/2003 | James et al. |
| 2003/0128496 | A1 | 7/2003 | Allen et al. |
| 2004/0096672 | A1 | 5/2004 | Lukas et al. |
| 2006/0024976 | A1 | 2/2006 | Waldfried et al. |
| 2006/0073424 | A1 | 4/2006 | Koveshnikov et al. |
| 2006/0228092 | A1 | 10/2006 | Hebrink et al. |
| 2006/0247404 | A1 | 11/2006 | Todd |
| 2007/0035839 | A1 | 2/2007 | Ibuki |
| 2008/0038561 | A1 | 2/2008 | Yoshizawa et al. |
| 2008/0049431 | A1 | 2/2008 | Boek et al. |
| 2008/0084532 | A1 | 4/2008 | Kurtin |
| 2008/0088793 | A1 | 4/2008 | Sverdrup et al. |
| 2008/0123049 | A1 | 5/2008 | Volk |
| 2008/0144185 | A1 | 6/2008 | Wang et al. |
| 2008/0170299 | A1 | 7/2008 | Kawabata |
| 2008/0171431 | A1 | 7/2008 | Yu et al. |
| 2008/0290435 | A1 | 11/2008 | Oliver et al. |
| 2008/0291394 | A1 | 11/2008 | Ishak |
| 2009/0015786 | A1 | 1/2009 | Harris |
| 2009/0027778 | A1 | 1/2009 | Wu et al. |
| 2009/0096106 | A1 | 4/2009 | Vrtis et al. |
| 2009/0289529 | A1 | 11/2009 | Ito et al. |
| 2009/0304924 | A1 | 12/2009 | Gadgil |
| 2010/0075056 | A1 | 3/2010 | Axisa et al. |
| 2010/0109486 | A1 | 5/2010 | Polyakov et al. |
| 2010/0168409 | A1 | 7/2010 | Fujita |
| 2010/0202054 | A1 | 8/2010 | Niederer |
| 2010/0238400 | A1 | 9/2010 | Volk |
| 2011/0075096 | A1 | 3/2011 | Ishak et al. |
| 2011/0085131 | A1 | 4/2011 | Gupta et al. |
| 2011/0096411 | A1 | 4/2011 | Henriksen et al. |
| 2011/0149410 | A1 | 6/2011 | Blum |
| 2011/0176105 | A1 | 7/2011 | Harris |
| 2011/0179861 | A1 | 7/2011 | Grange et al. |
| 2011/0235326 | A1 | 9/2011 | Yeh et al. |
| 2011/0294305 | A1 | 12/2011 | Jacobs et al. |
| 2012/0029416 | A1 | 2/2012 | Parker et al. |
| 2012/0032559 | A1 | 2/2012 | Hino et al. |
| 2012/0041553 | A1 | 2/2012 | Gupta et al. |
| 2012/0044571 | A1 | 2/2012 | Mukawa |
| 2012/0063000 | A1 | 3/2012 | Batchko et al. |
| 2012/0087015 | A1 | 4/2012 | Nibauer et al. |
| 2012/0092775 | A1 | 4/2012 | Duston et al. |
| 2012/0170920 | A1 | 7/2012 | Moreau et al. |
| 2012/0229754 | A1 | 9/2012 | Iyer et al. |
| 2012/0250151 | A1 | 10/2012 | Lee et al. |
| 2012/0287512 | A1 | 11/2012 | Egan et al. |
| 2013/0171546 | A1 | 7/2013 | White et al. |
| 2013/0176628 | A1 | 7/2013 | Batchko et al. |
| 2013/0300635 | A1 | 11/2013 | White et al. |
| 2014/0009039 | A1 | 1/2014 | Jenninger et al. |
| 2014/0078586 | A1 | 3/2014 | Spurgeon et al. |
| 2014/0153102 | A1 | 6/2014 | Chang |
| 2014/0186215 | A1 | 7/2014 | Shinta et al. |
| 2014/0227548 | A1 | 8/2014 | Myrick |
| 2014/0300857 | A1 | 10/2014 | Cohen-Tannoudji et al. |
| 2014/0312737 | A1 | 10/2014 | Jenninger et al. |
| 2015/0062719 | A1 | 3/2015 | Kyung et al. |
| 2015/0116656 | A1 | 4/2015 | Stevens et al. |
| 2015/0138110 | A1 | 5/2015 | Yairi et al. |
| 2015/0146161 | A1 | 5/2015 | Rigato et al. |
| 2015/0302990 | A1 | 10/2015 | Ghosh et al. |
| 2015/0323812 | A1 | 11/2015 | Ishak et al. |
| 2016/0004099 | A1 | 1/2016 | Steven et al. |
| 2016/0091635 | A1 | 3/2016 | Ibuki et al. |
| 2016/0187985 | A1 | 6/2016 | Lim et al. |
| 2017/0021385 | A1 | 1/2017 | Smith et al. |
| 2017/0045649 | A1 | 2/2017 | Bolis |
| 2017/0160600 | A1 | 6/2017 | Galstian et al. |
| 2017/0177106 | A1 | 6/2017 | Kihara |
| 2017/0184848 | A1 | 6/2017 | Vallius |
| 2017/0188021 | A1 | 6/2017 | Lo et al. |
| 2017/0192595 | A1 | 7/2017 | Choi et al. |
| 2017/0261653 | A1 | 9/2017 | Peyman |
| 2017/0299956 | A1 | 10/2017 | Holland et al. |
| 2017/0317269 | A1 | 11/2017 | Zhang et al. |
| 2017/0336641 | A1 | 11/2017 | Von Und Zu Liechtenstein |
| 2018/0255250 | A1 | 9/2018 | Price et al. |
| 2018/0275394 | A1 | 9/2018 | Yeoh et al. |
| 2018/0335649 | A1 | 11/2018 | Tsai |
| 2019/0173128 | A1 | 6/2019 | Visco et al. |
| 2019/0243123 | A1 | 8/2019 | Bohn |
| 2019/0296218 | A1 | 9/2019 | Ouderkirk et al. |
| 2019/0302479 | A1 | 10/2019 | Smyth et al. |
| 2020/0166742 | A1 | 5/2020 | Peyman |
| 2020/0251709 | A1 | 8/2020 | Lee et al. |

FOREIGN PATENT DOCUMENTS

| | | |
|---|---|---|
| WO | 2008/156166 A1 | 12/2008 |
| WO | 2010/078666 A1 | 7/2010 |
| WO | 2010/104904 A2 | 9/2010 |
| WO | 2019/183431 A1 | 9/2019 |
| WO | 2019/190887 A1 | 10/2019 |

OTHER PUBLICATIONS

U.S. Appl. No. 16/041,634, filed Jul. 20, 2018.
U.S. Appl. No. 16/035,562, filed Jul. 13, 2018.
U.S. Appl. No. 15/972,794, filed May 7, 2018.
U.S. Appl. No. 16/059,091, filed Aug. 9, 2018.
U.S. Appl. No. 16/106,945, filed Aug. 21, 2018.
Non-Final Office Action received for U.S. Appl. No. 16/013,837 dated Jan. 23, 2020, 22 pages.
Notice of Allowance received for U.S. Appl. No. 16/013,837 dated Apr. 14, 2020, 14 pages.
Preinterview First Office Action received for U.S. Appl. No. 15/992,731 dated Sep. 27, 2019, 17 pages.
Final Office Action received for U.S. Appl. No. 15/992,731 dated Jun. 2, 2020, 25 pages.
Non-Final Office Action received for U.S. Appl. No. 15/992,731 dated Aug. 24, 2020, 27 pages.
Examiner-Initiated Interview Summary received for U.S. Appl. No. 16/008,635 dated Apr. 20, 2020, 3 pages.
Notice of Allowance received for U.S. Appl. No. 16/008,635 dated May 4, 2020, 32 pages.
Non-Final Office Action received for U.S. Appl. No. 16/059,091 dated Apr. 8, 2020, 54 pages.

(56) References Cited

OTHER PUBLICATIONS

Final Office Action received for U.S. Appl. No. 16/059,091 dated Sep. 21, 2020, 18 pages.
Non-Final Office Action received for U.S. Appl. No. 16/106,945 dated Apr. 16, 2020, 59 pages.
Non-Final Office Action received for U.S. Appl. No. 16/041,634 dated Jul. 30, 2020, 24 pages.
Notice of Allowance received for U.S. Appl. No. 16/041,634 dated Aug. 28, 2020, 31 pages.
Preinterview First Office Action received for U.S. Appl. No. 16/018,752 dated Dec. 16, 2019, 19 pages.
Preinterview First Office Action received for U.S. Appl. No. 16/018,746 dated Jul. 14, 2020, 20 pages.
Notice of Allowance Action received for U.S. Appl. No. 16/018,746 dated Sep. 17, 2020, 24 pages.
Preinterview First Office Action received for U.S. Appl. No. 16/021,580 dated Aug. 4, 2020, 48 pages.
Press Kit Home, "Adaptive glasses", accessed at http://tvc.utah.edu, as accessed on Mar. 13, 2018, 5 pages.
Billah et al., "Microstructure Evolution and Electrical Characterization of Lanthanum doped Barium Titanate (BaTi03) Ceramics", International Conference on Mechanical Engineering, AIP Cont. Proc. 1754, accessed on Jul. 12, 2016, pp. 030006-1-030006-7.
Cao et al., Grain Size and Domain Size Relations in Bulk Ceramic Ferroelectric Materials, J. Phys. Chem Solids vol. 57, No. 10, pp. 1499-1505, 1996.
Ding et al., "Surface profiling of an aspherical liquid lens with a varied thickness membrane," Optics Express 3122-3132, vol. 25, No. 4 (Feb. 6, 2017).
He et al., Linear Electro-Optic Properties of Orthorhombic PZN-8%PT Single Crystal, IEEE Transactions on Ultrasonics, Ferroelectrics, and Frequency Control, vol. 58, No. 6 (Jun. 1, 2011).
Jiang et al., "Transparent Electro-Optic Ceramics and Devices", Proceedings vol. 5644, Optoelectronic devices and integration, accessed at https://doi.org/10.1117/12.582105, Jan. 17, 2005, 15 Pages.
Keplinger et al., "Stretchable, Transparent, Ionic Conductors", Science Magazine, vol. 341, DOI:10.1126/science.1240228, Accessed on Aug. 30, 2013, pp. 984-987.
Kong et al., "Transparent Ceramic Materials", Transparent Ceramics, Topics in Mining, Metallurgy, and Materials Engineering, Ch. 2, DOI: 10.1007/978-3-319-18956-7_2, Springer international Publishing Switzerland 2015, pp. 29-91.
Patra et al., "Comparison on Optical Properties of Pure and Doped Lithium Tetraborate Single Crystals and Glasses", Solid State Physics: Proceedings of the 56th DAE Solid State Physics Symposium 2011, AIP Conf. Proc. 1447, Dec. 11, 2012, pp. 1335-1336.
Riegler et al., "Index Matching Silicone for High Brightness LED Packaging", IMAPS International Conference on Device Packaging Mar. 13-16, Scottsdale AZ., Accessed on Mar. 18, 2005, 17 Pages.
Shian et al., Tunable Lenses using Transparent Dielectric Elastomer Actuators, Optics Express, vol. 21, No. 7 (Apr. 2, 2013).
Non-Final Office Action received for U.S. Appl. No. 16/016,428 dated Mar. 12, 2021, 56 pages.
Notice of Allowance received for U.S. Appl. No. 15/972,794 dated Oct. 16, 2020, 22 pages.
Notice of Allowance received for U.S. Appl. No. 15/992,731 dated Nov. 18, 2020, 37 pages.
Final Office Action received for U.S. Appl. No. 16/106,945 dated Nov. 24, 2020, 94 pages.
Final Office Action received for U.S. Appl. No. 16/018,752 dated Nov. 30, 2020, 41 pages.
Notice of Allowance received for U.S. Appl. No. 16/018,746 dated Nov. 3, 2020, 39 pages.
Notice of Allowance received for U.S. Appl. No. 16/021,580 dated Dec. 9, 2020, 68 pages.
Preinterview First Office Action received for U.S. Appl. No. 16/021,650 dated Feb. 1, 2021, 47 pages.
Gurvich, Mark R., "On Characterization of Anisotropic Elastomeric Materials for Structural Analysis", Rubber Chemistry and Technology, vol. 77, No. 1, 2004, pp. 115-130.
Non-Final Office Action received for U.S. Appl. No. 16/106,945 dated Mar. 30, 2021, 111 pages.
Notice of Allowance received for U.S. Appl. No. 16/018,752 dated Mar. 10, 2021, 32 pages.
Communication pursuant to Article 94(3) EPC received for EP Patent Application Serial No. 19715707.6 dated Mar. 22, 2021, 5 page.
Non-Final Office Action received for U.S. Appl. No. 16/035,562 dated Jun. 10, 2021, 36 pages.
Non-Final Office Action received for U.S. Appl. No. 16/016,428 dated Jun. 16, 2021, 43 pages.
"Adjustable Lens Glasses: How They Work," UZOOM Adlens, Retrieved on Mar. 28, 2018, 9 pages, Retrieved from the Internet: URL: https://adlens.com/how-it-works/.
"Adjustable Reading Glasses," Retrieved on May 7, 2018, 1 page, Retrieved from internet URL: https://adlens.com/?gclid= EAIaIQobChMljOjcsLj02gIVkIqGCh2GMAsiEAAYAS AAEgL . . . .
Cooke J.M., et al., "Optical Lens Assemblies, Head-Mounted Displays, and Methods of Altering Optical Properties of Optical Lens Assemblies," U.S. Appl. No. 16/013,837, filed Jun. 20, 2018, 67 pages.
Cooke J.M., et al., "Optical Lens Assemblies, Head-Mounted Displays, and Related Methods," U.S. Appl. No. 16/021,580, filed Jun. 28, 2018, 49 pages.
"Displacement Modes of Piezoelectric Actuators," Piezo Technology, Retrieved on Mar. 14, 2018, 12 pages, Retrieved from the Internet: URL: https://www.piceramic.com/en/piezo-technology/ properties-piezo-actuators/displacement-modes/.
"Focus Tunable Lenses," Optotune, Mar. 13, 2018, 2 Pages, Retrieved from the Internet: URL: http://www.optotune.com/technology/focus-tunable-lenses.
Guha I.F., et al., "Creating Nanoscale Emulsions Using Condensation," Nature Communications, Published: Nov. 8, vol. 8, Article 1371, pp. 1-7.
"Highly Reliable Multilayer Piezo Actuators," Piezo Technology, Retrieved on Mar. 14, 2018, 8 pages. Retrieved from the Internet: URL: https://www.piceramic.com/en/piezo-technology/picma/.
Hocking L.M., "The Effect of Slip on the Motion of a Sphere Close to a Wall and of Two Adjacent Spheres," Journal of Engineering Mathamatics, 1973, vol. 7 (3), pp. 207-221.
"How Does it Work," POLIGHT, Retrieved on Mar. 13, 2018, 3 pages, Retrieved from the Internet: URL: http://www.polight.com/ technology-and-products/how-does-it-work/default.aspx.
International Preliminary Report on Patentability for International Application No. PCT/US2019/023484, dated Oct. 1, 2020, 8 pages.
International Preliminary Report on Patentability for International Application No. PCT/US2019/023485, dated Oct. 8, 2020, 8 Pages.
International Search Report and Written Opinion for International Application No. PCT/US2019/023484, dated Jul. 3, 2019, 9 pages.
International Search Report and Written Opinion for International Application No. PCT/US2019/023485, dated Jul. 4, 2019, 11 Pages.
Knapp K., et al., "Understanding Zirconia Crown Esthetics and Optical Properties," Retrieved on Jun. 12, 2018, vol. 2(4), 17 pages, Retrieved from the Internet: URL: http://glidewelldental.com/ education/inclusive-dental-implant-magazine-volume-2-issue-4/.
Merriam-Webster., "Porosity," Dictionary, Retrieved on Apr. 8, 2020, pp. 1-8, Retrieved on the Internet: URL: https://www.merriam-webster.com/dictionary/porosity.
Ouderkirk A.J., et al., "Apparatuses, Systems, and Methods for Adjusting Fluid Lenses," U.S. Appl. No. 16/008,635, filed Jun. 14, 2018, 41 Pages.
Ouderkirk A.J., et al., "Electroactive Polymer Devices and Nanovoided Polymer Materials and Methods and Systems fabrication Thereof," U.S. Appl. No. 16/106,945, filed Aug. 21, 2018, 98 pages.
Ouderkirk A.J., et al., "Electroactive Polymer Devices, Systems, and Methods," U.S. Appl. No. 16/035,562, filed Jul. 13, 2018, 55 Pages.

(56) References Cited

OTHER PUBLICATIONS

Ouderkirk A.J., et al., "Electroactive Polymer Devices, Systems, and Methods," U.S. Appl. No. 16/059,091, filed Aug. 9, 2018, 68 Pages.

Ouderkirk A.J., et al., "Multi-Element Prescription Lenses With Eye-Tracking," for U.S. Appl. No. 16/041,634, filed Jul. 20, 2018, 87 Pages.

Ouderkirk A.J., et al., "Nanovoided Electroactive Polymer Devices, Systems, and Methods," U.S. Appl. No. 16/041,858, filed Jul. 23, 2018, 65 Pages.

Ouderkirk A.J., et al., "Optical Lens Assemblies and Related Methods," U.S. Appl. No. 16/018,752, filed Jun. 26, 2018, 35 pages.

Ouderkirk A.L., et al., "Optical Devices, Systems, and Methods of Manufacturing," U.S. Appl. No. 62/646,900, filed Mar. 22, 2018, 13 pages.

Ouderkirk A.L., et al., "Optical Devices, Systems, and Methods of Manufacturing," U.S. Appl. No. 62/650,254, filed Mar. 29, 2018, 9 pages.

"Piezoelectric Materials, New Materials, Piezo Theory," APC International, Ltd., Retrieved on Mar. 15, 2018, 1 page, Retrieved from the Internet: URL: https://www.americanpiezo.com/knowledge-center/piezo-theory/new-materials.html.

Smyth K.M., et al., "Optical Lens Assemblies and Related Methods," U.S. Appl. No. 16/018,746, filed Jun. 26, 2018, 45 pages.

Smyth K.M., et al., "Optical Lens Assemblies, Head-Mounted Displays, and Related Methods," U.S. Appl. No. 16/016,428, filed Jun. 22, 2018, 78 pages.

Smyth K.M., et al., "Optical Lens Assemblies, Head-Mounted Displays, and Related Methods," U.S. Appl. No. 16/021,650, filed Jun. 28, 2018, 52 pages.

Smyth K.M., et al., "Systems and Methods for Actuation of Asymmetric Optical Elements," U.S. Appl. No. 15/992,731, filed May 30, 2018, 65 pages.

Wang Y., et al., "A Highly Stretchable, Transparent, and Conductive Polymer," Science Advances, Mar. 10, 2017, vol. 3 (3), Article e1602076, pp. 1-10.

Zhao P., et al., "Spherical Aberration Free Liquid-Filled Tunable Lens with Variable Thickness Membrane," Optics Express, Aug. 5, 2015, vol. 23 (16), pp. 21264-21278, Retrieved from the Internet: URL: https://doi.org/10.1364/0.23.021264.

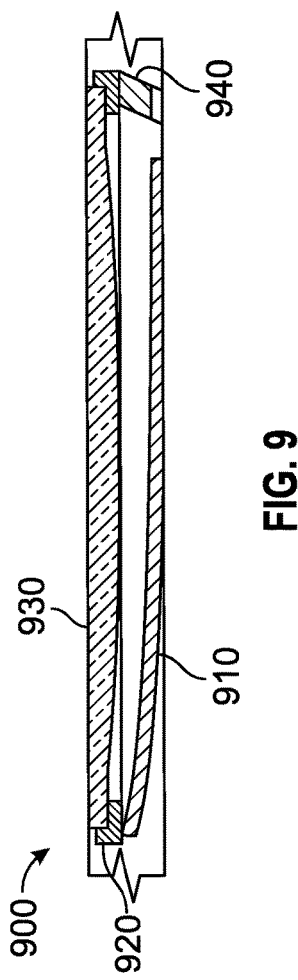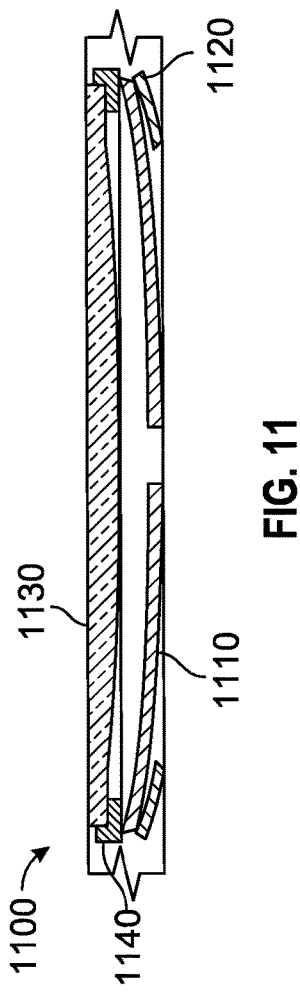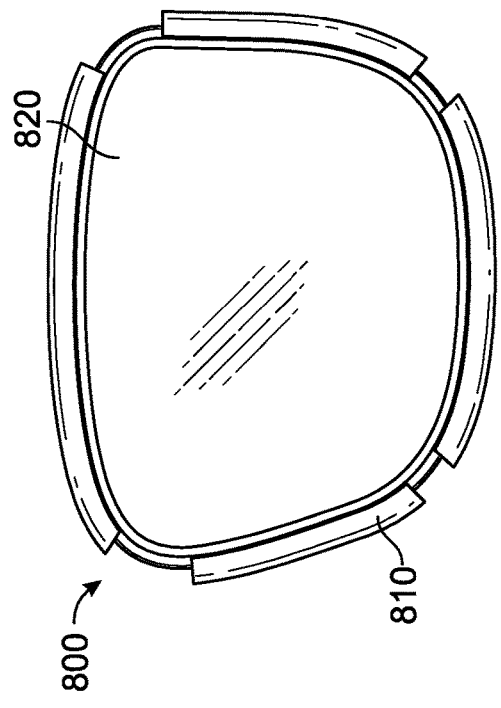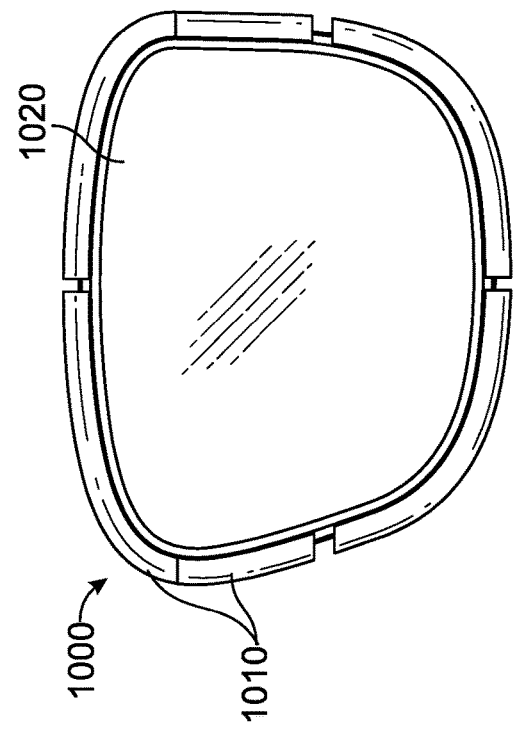

APPARATUSES AND METHODS FOR ACTUATION OF OPTICAL ELEMENTS

CROSS-REFERENCE TO RELATED APPLICATIONS

This application is a continuation of U.S. Non-Provisional patent application Ser. No. 15/992,731, filed May 30, 2018, titled "SYSTEMS AND METHODS FOR ACTUATION OF ASYMMETRIC OPTICAL ELEMENTS," which claims the benefit of U.S. Provisional Application No. 62/646,900, filed Mar. 22, 2018 and entitled "OPTICAL DEVICES, SYSTEMS, AND METHODS OF MANUFACTURING." The entire contents of each of these applications are incorporated herein by reference.

BACKGROUND

This disclosure relates generally to actuation devices, systems, and methods for deformable optical elements of adjustable lenses.

Adjustable-lens systems may be useful in a variety of devices, including eyeglasses, cameras, and artificial reality systems. Unfortunately, some traditional motor-driven actuation mechanisms may be noisy, which may make them unsuitable for use in head-worn displays where the motors may be in close proximity to a user's ears. Furthermore, traditional adjustable-lens actuation systems may include one or more motors, cams, gears, linkages, etc. These systems may suffer from high frictional losses, making them inefficient for use in situations where power is at a premium. Such systems may also be heavy and bulky, making them impractical for use in devices with weight and/or size constraints. What is needed, therefore, are more effective, efficient, or otherwise improved adjustable-lens optical systems.

SUMMARY

As will be described in greater detail below, the instant disclosure describes embodiments of a direct drive actuation mechanism for an asymmetric adjustable lens, based on in-frame perimeter mounting within an optical assembly or sub-assembly in some examples.

At least one embodiment may include an apparatus that may have an asymmetric adjustable lens and one or more actuators coupled to a deformable optical element of the asymmetric adjustable lens in a direct-drive configuration. Mechanical action of the one or more actuators may apply force to the deformable optical element of the asymmetric adjustable lens, and the force applied by the mechanical action of the one or more actuators may change an optical property of the asymmetric adjustable lens. According to some embodiments, a vector corresponding to a force applied by mechanical action of a first actuator of the one or more actuators may be different from a vector corresponding to a force applied by mechanical action of a second actuator of the one or more actuators.

In one example, the apparatus also may include a lens-display assembly with the asymmetric adjustable lens positioned as a proximal lens and an additional asymmetric adjustable lens positioned as a distal lens in tandem with the proximal lens along an optical axis. The apparatus also may include a see-through display situated between the proximal lens and the distal lens such that, when the lens-display assembly is held up to a face of a user, the user views the see-through display through the proximal lens and views past the see-through display through the proximal lens and the distal lens. The one or more actuators may be coupled to the distal lens such that mechanical action by the one or more actuators simultaneously adjusts the proximal lens and the distal lens. More generally, adjustment of the distal and proximal lenses may be performed by the same actuator or by different actuators. Moreover, in an embodiment, adjusting the proximal lens may alter an apparent accommodation distance of a virtual image displayed on the see-through display, and the distal lens may adjust as the proximal lens adjusts such that an appearance of a real-world image viewable past the see-through display is not substantially altered when the proximal lens adjusts.

In another example, the asymmetric adjustable lens may include a deformable medium at least partially encapsulated by the deformable optical element, and the force applied by the mechanical action of the one or more actuators may change the optical property of the asymmetric adjustable lens by causing deformation of the deformable optical element. In a further example, the mechanical action may include a transverse tip deflection of at least one of the one or more actuators, and the transverse tip deflection may adjust the optical property of the asymmetric adjustable lens by deforming the asymmetric adjustable lens. In other examples, at least one of the one or more actuators may include an electroactive bender, an electroactive stack, a piezoelectric bender, a piezoelectric stack, an electrostrictive bender, and/or an electrostrictive stack. Examples of actuator materials may include PZT (lead zirconate titanate), barium titanate, and single crystals including PMN-PT (lead magnesium niobite-lead titanate) and PZN-PT (lead zirconate niobate-lead titanate).

In some examples, the apparatus may include a sensor that may measure a state of the asymmetric adjustable lens and may include a controller that may be in communication with the sensor and that may actuate at least one of the one or more actuators via closed-loop control based on data received from the sensor. In one example, the one or more actuators may include an electrically-driven actuator. A controller may actuate the electrically driven actuator via current control, voltage control, and/or hybrid current-voltage control, and an electrical power source may be coupled to the electrically driven actuator (via, e.g., the controller).

In at least one example, the one or more actuators may be tangentially mounted along a perimeter of the deformable optical element and may apply force at discrete points on the perimeter of the deformable optical element. In one example, the apparatus may include a an actuator configuration in which, as displacement of the actuator increases, force applied by the actuator also increases.

According to one embodiment, at least one of the one or more actuators in the apparatus may be radially mounted along a perimeter of the deformable optical element, and the force applied by the mechanical action may act on a perimeter of the deformable optical element. In one example, the one or more actuators may include a continuous ring contoured along the perimeter of the deformable optical element.

In some embodiments, the apparatus also may include an artificial reality display element and a control subsystem that may determine a change to be applied to the optical property based on a virtual location of a virtual object displayed by the artificial reality display element. The control subsystem may trigger the change by directing the one or more actuators to apply the force to the deformable optical element.

At least one embodiment is a method that may include steps of receiving an indication of an adjustment to be made to an optical property of an asymmetric adjustable lens, and in response to receiving the indication of the adjustment, controlling one or more direct drive actuators so that force applied by mechanical action of the one or more direct drive actuators may change the optical property of the asymmetric adjustable lens by applying force to a deformable optical element of the asymmetric adjustable lens. In one example, the indication of the adjustment may include user input; in another example, the indication of the adjustment may include data received from a sensor. Moreover, an amount of force applied by mechanical action of a first actuator of the one or more direct drive actuators may be different from an amount of force applied by mechanical action of a second actuator of the one or more direct drive actuators.

At least one embodiment is a method that may include one or more steps of (a) mounting one or more actuators to an eyewire of a head-worn optical device, (b) mechanically coupling, in a direct-drive configuration, the one or more actuators to a perimeter of a deformable optical element of an asymmetric adjustable lens, and (c) communicatively coupling, to the one or more actuators, a control system programmed to direct the one or more actuators to apply force to the deformable optical element to change an optical property of the asymmetric adjustable lens.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

FIGS. 4-11, 12A, and 12B depict various types of actuators and various direct-drive configurations for coupling these actuators to asymmetric adjustable lenses.

Figure 1:
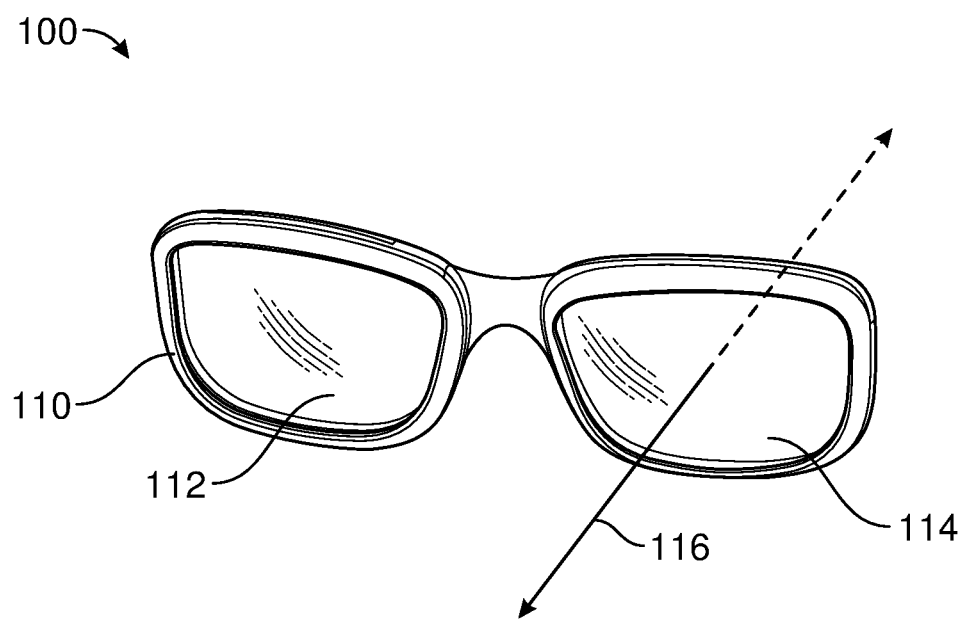
FIG. 1 is a perspective view of a pair of adjustable lenses fitted in enclosures that include direct-drive actuators.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

This disclosure is generally directed to optical systems and devices having an adjustable asymmetric lens and an actuator that can adjust an optical property of the lens by applying force directly to a deformable element of the lens. The actuator may be mounted in-frame in a perimeter (e.g., an eyewire) of an optical assembly such that it applies force directly to a perimeter volume of the deformable optical element. By being mounted in this manner, the actuator may be positioned outside of an optical aperture of the lens and, as a result, may not affect visibility through the lens. The actuator may also be designed to apply equal or varied force at discrete points or along a spatially defined distribution on the perimeter of the lens, enabling the actuation system to compensate for the asymmetric shape of lenses that may be used in eyeglasses and artificial reality systems. The lens-actuator assemblies presented herein may also be implemented in a variety of other types of optical systems and in many other configurations.

The directly-driven, adjustable-focus lenses discussed herein may provide one or more advantages over indirectly-driven systems. For example, in contrast to systems whose actuators apply force indirectly (e.g., systems that include motors, belts, gears, etc.), direct-drive systems (e.g., systems driven by an electroactive bender, a voice coil actuator, a shape memory alloy, a hydraulic pump, etc.) may create less noise, which may be particularly beneficial in head-worn systems given the proximity of the actuator to the ears. Direct-drive systems may also induce fewer vibrations that can cause issues for comfortable use, especially over relatively long periods of time. Furthermore, direct-drive configurations may be implemented with low hysteresis and may be held precisely through open- and/or closed-loop control.

Embodiments presented herein may also provide one or more features and advantages that are not available in, or provided by, traditional adjustable-focus systems. For example, many traditional adjustable-focus systems may not be configured for effective use with asymmetric lenses. In contrast, the direct-drive systems presented herein may compensate for asymmetries common in eyeglasses and AR systems by providing varied force and displacement at discrete points or along a spatially defined distribution at the perimeter of an asymmetric element. The adjustable-focus systems of this disclosure may also enable head-worn artificial reality systems to be lighter and/or to switch optical power faster than traditional adjustable-focus technologies used in artificial reality systems. Thus, as discussed in greater detail below, the various embodiments disclosed herein, whether used alone or in combination, may help optimize the immersiveness, enjoyability, and/or utility of various types of optical systems.

Figure 2:
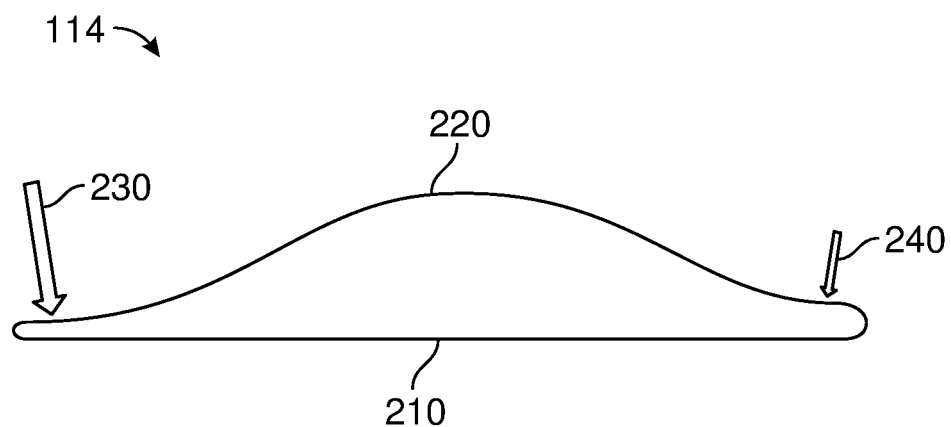
FIGS. 2 and 3 are side views of asymmetric adjustable lenses.
Figure 3:
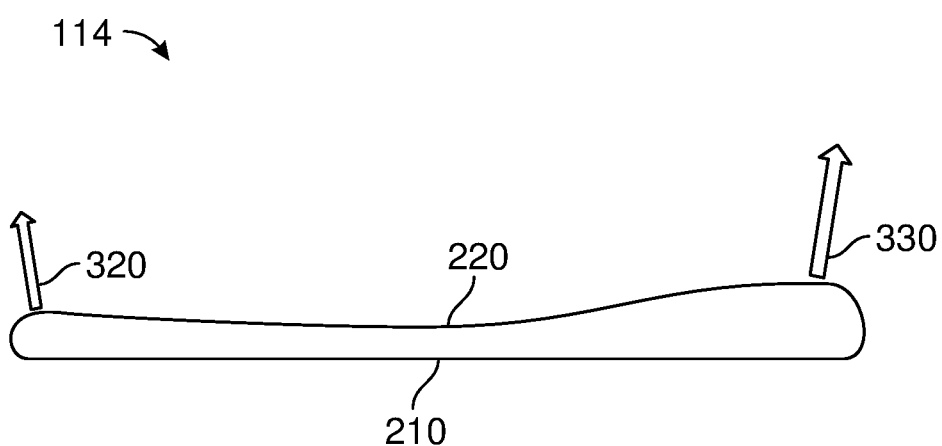
Figure 12A:
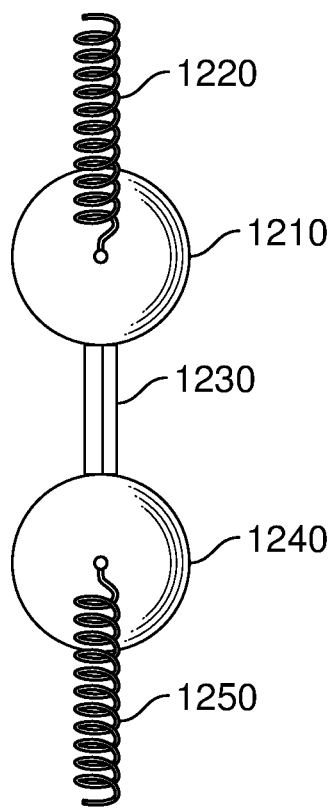
Figure 13:
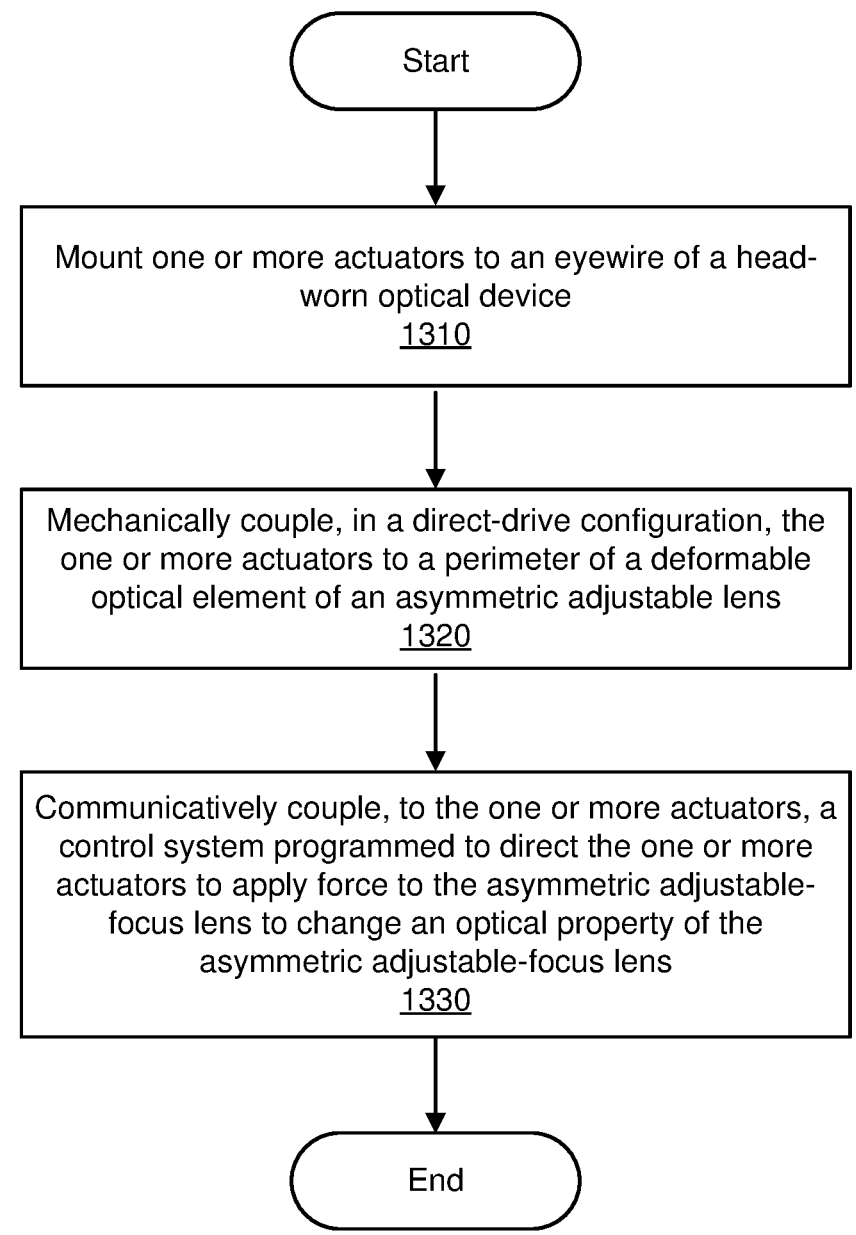
FIG. 13 is a flow diagram of a method for assembling a head-word apparatus that includes one or more directly-driven adjustable lenses.
Figure 14:
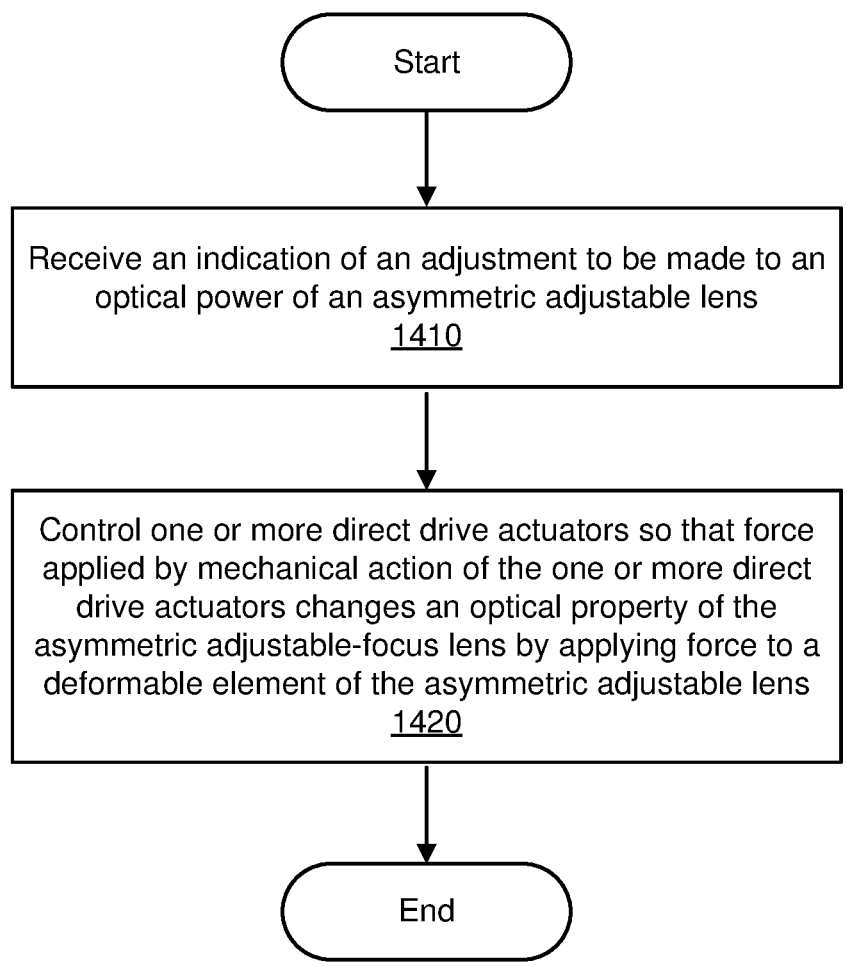
FIG. 14 is a flow diagram of a method for adjusting an optical property of an adjustable lens.

The following will provide, with reference to FIGS. 1-3, descriptions of various types and forms of asymmetric adjustable lenses. In addition, the discussion associated with FIGS. 4-12 will provide examples of various types of actuators and various direct-drive configurations for coupling these actuators to asymmetric adjustable lenses. Furthermore, the discussion corresponding to FIG. 13 presents a method for assembling a head-worn optical system for directly driving adjustable-focus lenses, and the discussion corresponding to FIG. 14 presents a method for controlling direct drive actuators. The following discussion also provides, with reference to FIGS. 15-16, examples of artificial reality system embodiments, and provides, with reference to FIGS. 17-19, examples of using directly-driven adjustable-focus lenses within artificial reality systems (e.g., to reduce, minimize, or eliminate accommodation-vergence conflict caused by augmented reality displays). In addition, the discussion of FIGS. 20-27 presents examples of passive and active mechanisms for augmenting the force applied by direct-drive actuators. After the discussion of FIG. 27, this disclosure provides a description of various types of lenses (e.g., thin liquid lenses) that may be driven by direct-drive actuators and various enhancements (e.g., selectively transmissive coatings, variable-thickness coatings, etc.) that may be made to such lenses.

The following disclosure focuses on direct-drive actuation systems configured to modify the optical power or other optical properties of lenses in head-mounted devices and eyeglasses. However, certain embodiments described herein are also applicable to other devices that may have adjustable lenses, such as cameras, viewfinders, and/or any other optical system suited for use with adjustable lenses.

Turning to FIG. 1, an optical system 100 may include a housing 110 that includes one or more asymmetric lenses, such as lens 112 and lens 114. In various embodiments, an "asymmetric" lens may be a lens whose perimeter is non-circular. Examples of lenses that are asymmetric include lenses whose perimeters form an ellipse, an oval, an ovoid, a polygon, or any other non-circular shape that is at least partially asymmetric about an optical axis along which the lens transmits light. For example, lens 114 may be referred to as asymmetric because it lacks symmetry about an optical axis, such as optical axis 116, which may be a straight line that passes through the center curvature (e.g., the optical center) of a lens, a straight line passing through a geometric center of a lens, a straight line that is perpendicular to an optical surface of a lens, etc.

A lens may be considered to be at least partially asymmetric about an optical axis if the lens lacks rotational symmetry relative to the optical axis and/or if the lens lacks reflectional symmetry relative to at least one plane in which the optical axis is embedded. In the context of a head-worn display, an example of a lens that is asymmetric about an optical axis may be a lens with a design that has contour line patterns positioned differently into the nasal and temporal areas to produce a right lens design (e.g., lens 112) and a left lens design (e.g., lens 114).

In addition to having various shapes, asymmetric lenses may be embedded in various types and forms of housings. For example, asymmetric lenses may be coupled to a frame of a pair of eyeglasses (e.g., for use as an alternative to traditional bifocals) or of a head-worn augmented reality system. Alternatively, asymmetric lenses may be included in viewfinders of camera assemblies, in machine vision systems, etc.

As shown in FIG. 2, asymmetric lens 114 may be an adjustable lens with a structural support element 210 (e.g., a rigid backplane) and a deformable optical element 220. In various embodiments, an adjustable lens may include any suitable type of lens with adjustable optical properties (e.g., adjustable optical power/focal length, correcting for wavefront distortion and/or aberrations, etc.). In some examples, as will be explained in greater detail below, an adjustable lens may include a liquid lens. For example, lens 114 may be filled with an optical medium that is at least partially encapsulated by a deformable optical element (i.e., between structural support element 210 and deformable optical element 220). For example, lens 114 may be filled with a liquid or a semi-solid material (e.g., a gel, a semi-solid polymer, etc.). In general, lens 114 may contain a substantially transparent material that deforms and/or flows under pressure.

Structural support element 210 and deformable optical element 220 may be composed of any suitable materials. In some examples, structural support element 210 may include a rigid material. For example, structural support element 210 may be composed of a rigid, substantially transparent polymer. Deformable optical element 220 may include a substantially transparent and elastic material. For example, deformable optical element 220 may be composed of a natural or synthetic elastomer that returns to a resting state when a deforming force is removed. As will be explained in greater detail below, in some examples deformable optical element 220 may be deformed using by directly-driven force to produce a desired optical power or other optical property for adjustable lens 114.

Forces applied to lens 114 may be uniform around a perimeter of lens 114 or may be variable around the perimeter of lens 114. For example, a vector corresponding to a force applied by mechanical action of a first actuator may be the same as a vector corresponding to a force applied by mechanical action of a second actuator. Alternatively, as shown in the examples in FIGS. 2 and 3, a vector corresponding to a force applied by mechanical action of a first actuator may be different from a vector corresponding to a force applied by mechanical action of a second actuator of the one or more actuators.

FIG. 2 depicts an asymmetric adjustable lens 114 receiving force applied by mechanical action of two different actuators. In this example, a first actuator (not shown) may apply a pushing force 230 having a vector of a first magnitude and first direction to a first area on the perimeter of lens 114. A second actuator (not shown) may apply a pushing force 240 having vector of a second magnitude and second direction to a second area on the perimeter of lens 114. As shown, force 230 may have a magnitude greater than force 240; consequently, deformable optical element 220 may be compressed to a greater extent in the region to which force 230 is applied than in the region to which force 240 is applied, as may be necessary to achieve a desired optical power or other optical property for an asymmetric lens.

FIG. 3 depicts pulling forces being applied to lens 114. A first actuator (not shown) may apply a pulling force 320 of a first magnitude and first direction to a first area on the perimeter of lens 114. A second actuator (not shown) may apply a pulling force 330 of a second magnitude and second direction to a second area on the perimeter of the lens. Force 330 may have a magnitude greater than force 320, and each force may act in a direction away from lens 114. Consequently, deformable optical element 220 may be distended to a greater extent in the region to which force 330 is applied than in the region to which force 320 is applied, as may be necessary in order to achieve a desired optical power for an asymmetric lens. Those skilled in the art will understand that other embodiments may use various combinations of compression and distension, with various numbers of actuators applying varying forces to various locations on a deformable optical element to achieve desired optical properties for the lens.

The forces shown in FIGS. 2 and 3, as well as any other suitable forces, may be applied by any suitable type of direct-drive actuator. As used in some embodiments, the term "direct-drive actuator" may refer to any actuator used in a direct-drive system or configuration (e.g., any configuration that does not involve an intermediate, off-axis device to transmit power).

In contrast, indirect-drive systems may have at least one drive-train component (e.g., a belt, a chain, a ball-screw mechanism, a gear, etc.) that is not connected along the same axis of movement as the actuator. Examples of direct-drive actuators may include, without limitation, electrically driven actuators, electroactive benders, voice coil actuators, shape memory alloys, hydraulic pumps, etc.

As noted, in various embodiments, a direct-drive actuator may include a bender. In some examples, the term "bender" may refer, without limitation, to an electrically-driven actuator based on a plate or beam design that converts in-plane contraction, via an applied electric field, into out-of-plane displacement. A bender or bending actuator may include an all-electroactive or composite material stack operated in a bimorph, unimorph, or multilayered monolith configuration. In some embodiments, the term "unimorph bender" may refer, without limitation, to a beam or plate having an electroactive layer and an inactive layer, in which displacement results from contraction or expansion of the electroactive layer. In some embodiments, the term "bimorph bender" may refer, without limitation, to a beam or plate having two electroactive layers, in which displacement results from expansion or contraction of one layer with alternate contraction or expansion of the second layer.

In some embodiments, the term "multilayer bender" may refer, without limitation, to a multilayer stack of electroactive, electrode, and insulation layers integrated with alternating contracting and expanding electroactive layers into a monolithic bender. The piezoelectric layers in multilayer piezoelectric benders may enable high electric fields (and therefore high force and displacement) to occur at low voltages. Multilayer benders may include multiple thin piezoceramic layers, which may require lower voltages to achieve similar internal stress to bimorph and unimorph designs. Charge and voltage control in open or closed loops may also be implemented in multilayer benders, with some adjustment. In some examples, a control system for a multilayer bender may not require a high voltage power supply.

According to some embodiments, an actuator may be a frame-contoured ring bender and/or may include stacked or overlapping benders. Furthermore, actuator volume may be constrained to an edge region outside an optical aperture, which may include a perimeter volume of an asymmetric lens, an optical element, an optical sub-assembly, etc. As noted, an actuator (or a set of actuators) may provide equal or varied force and displacement at discrete points or along a spatially-defined distribution at the perimeter of an asymmetric lens.

In some embodiments, the term "electroactive" may refer, without limitation, to a material or composite that deforms with the application of electrical energy. Examples include, but are not limited to, piezoelectric and electrostrictor polymers and ceramics, and dielectric elastomers. Electrically driven actuators on artificial reality head-mounted devices may be powered by the same power source that drives the head-mounted device. Actuators on eyeglasses may be powered by any suitable battery source or other power supply.

The direct-drive benders disclosed herein may include a nanovoided electroactive polymer element that is disposed between two electrodes. In such examples, methods of forming an electroactive actuator may involve forming electrodes and an electroactive polymer simultaneously (e.g., via coflowing, slot die coating, etc.).

As another example, a method for making a direct-drive, electroactive actuator may include (1) providing a first conductive layer, (2) applying a layer of a curable material containing a solvent (e.g., a non-reacting solvent), (3) at least partially curing the curable material, (4) removing the solvent, and (5) applying a second conductive layer. The curable material may be soluble in the solvent and the at least partially cured material may not be completely soluble in the solvent. In at least one embodiment, the curable material may contain at least an average of 10% by weight of solvent. The curable material may be cured in any suitable manner (e.g., by a chain-reaction or a step-reaction). Suitable materials may include a silicone resin, such as polydimethyl silicone (PDMS), where the PDMS may be initiated by either a thermal or preferably a UV initiated hydrosilation catalyst. Suitable hydrosilation catalysts may include Bis (acetylacetonate)platinum II, n(2-cyclopentadienyl) trialkylplatinum, and the like. Additionally or alternatively, suitable materials may include acrylates, styrenes, polyesters, polycarbonates, and epoxies. The chain-reaction polymerized systems may be UV or other actinic radiation based (e.g., curable using x-rays, EUV, or electron beams, carbon compounds such as graphene, etc.).

The curing process may also be initiated by, for example, remotely forming the free-radical initiator and bringing that in contact with the curable material. The layer of curable material and/or one at least one of the first conductive layer and the second conductive layer may be printed (via, e.g., inkjet printing, silkscreen printing, etc.). In some embodiments, an actuator may include at least a first and a second electrode, where a polymer having voids (e.g., a nanovoided polymer) is disposed between the first and the second electrode. In some embodiments, the curable material may contain particles of a material with a high dielectric constant (e.g., barium titinate). The particles may have an average diameter of between approximately 10 and approximately 1000 nm (e.g., between approximately 10 and approximately 100 nm, between approximately 20 and approximately 100 nm, etc.).

In some embodiments, the electroactive polymer elements may each include an elastomer having an effective Poisson ratio of less than 0.35 and an effective uncompressed density that is less than 90% of the elastomer when densified. Electrodes in the stack may optionally be electrically connected to at least one adjacent common electrode extending along a lateral periphery of the stack via at least one schoopage (i.e., contact) layer.

Embodiments described herein may provide tunability to specified force and displacement requirements through a selection of radial or tangential actuation in combination with single layer, stacked, or overlapping architecture, as explained below in greater detail. Force or displacement amplification is possible through embodiments comprising stacked or overlapping bender designs and/or other force augmentation mechanisms as discussed in greater detail in the disclosure corresponding to FIGS. 20-27.

Since tensile strengths of piezoceramic and single-crystal actuators are relatively low (e.g. 5-10 MPa), in one or more embodiments pre-loading may be used to maintain stack actuators in compression. Moreover, as noted above, in an embodiment a lens membrane surface may be curved at zero electrical power, and in such cases pre-loading may be used to induce the curvature of the membrane surface. Any suitable pre-loading technique may be used, including flexures, wedges, screw-nut arrangements, and/or magnets.

Examples of perimeter-mounted electroactive benders are depicted in FIGS. 4-11. In the depicted benders, an applied electric current or voltage may result in a displacement (e.g., a transverse tip deflection) and force to create deformation of an edge of a deformable optical element. The force and displacement at the perimeter may be varied discretely or in a specified distribution to achieve high force or high displacement application requirements through radially- or tangentially-mounted single or multi-bender systems. While the following examples are described as being perimeter mounted, alternate embodiments may encompass any locations that enable suitable deformation of a deformable element.

FIGS. 4-7 depict examples of benders mounted radially along perimeters of adjustable lenses. A radial bender configuration 400 (see FIG. 4) of an embodiment may include a continuous ring 410 contoured along the edge of an asymmetric optical element 420. Deflection and force may be nearly equally distributed along the edge of optical element 420. In other embodiments, deflection and/or force may be distributed in unequal amounts to account for asymmetric properties of the lens and/or desired optical power.

Figure 5:
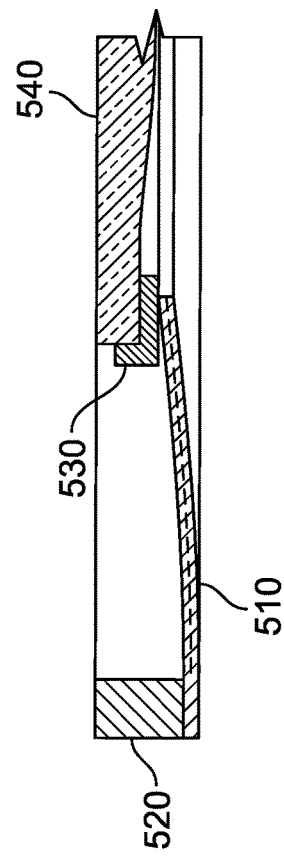

A cross-section of a radial bender mounting configuration 500, which may correspond to configuration 400, is depicted in FIG. 5. A bender 510 may be fixed to an eyewire 520. Tip deflection and force may be applied along a boundary 530 coupling bender 510 to a deformable optical element 540. In other embodiments, tip deflection and/or force may be applied to other areas of deformable optical element 540 to account for asymmetric properties of the lens and/or desired optical power or other optical properties.

Figure 4:
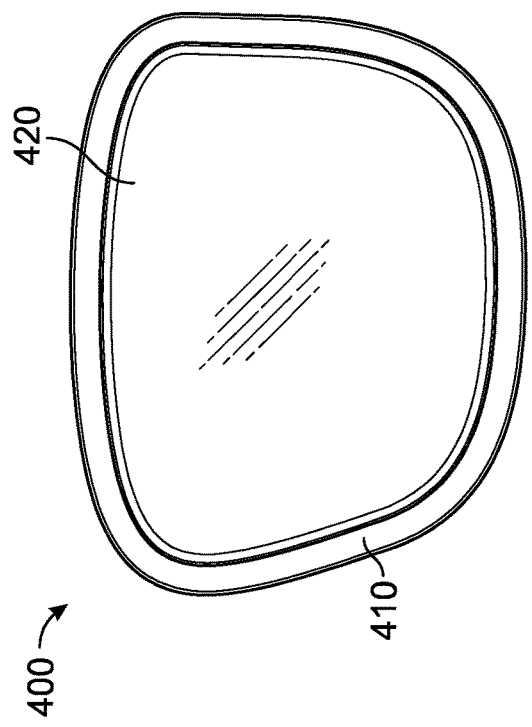
Figure 6:
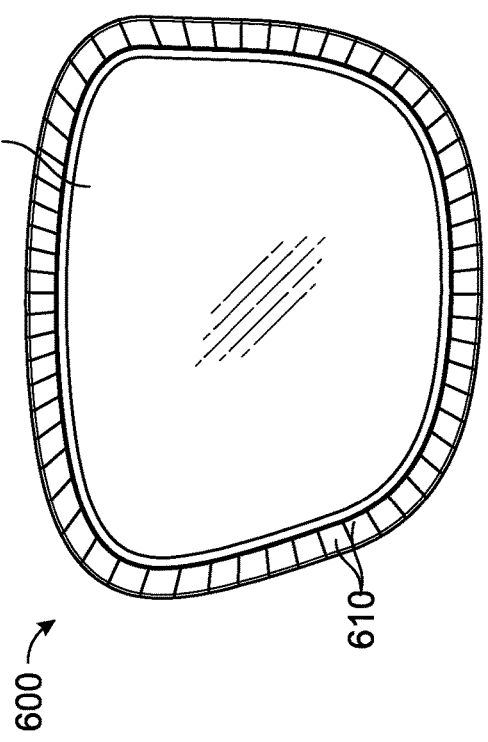

FIG. 6 shows a radially mounted bender configuration 600 similar to configuration 400 in FIG. 4, except that the radially mounted bender on asymmetric optical element 620 may be separated into multiple, "parallelized" adjacent benders 610. Benders 610 may operate as beams, while continuous ring 410 may more closely correspond to an annular plate. Annular-plate or ring-based benders may have the potential advantage of larger displacement with less compromise in actuation force compared to beam bender designs. However, the parallel beam bender configuration 600 may be easily integrated into a point-varied force and displacement architecture and may provide larger displacement for low force applications.

Figure 7:
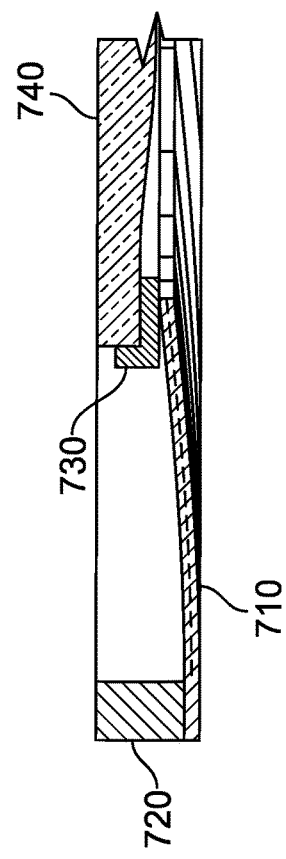

FIG. 7 shows a segmented, parallel mounting configuration 700, which may correspond to configuration 600 in FIG. 6. As shown in FIG. 7, benders 710 may be fixed to eyewire frame 720. Tip deflection and reactive force may be applied along a boundary 730, which may couple benders 710 to deformable element 740. In other embodiments, tip deflection and/or reactive force may be applied to other areas of deformable element 740 to account for asymmetric properties of deformable element 740 and/or to adjust optical power or other optical properties.

FIG. 8-11 depict embodiments having benders mounted tangentially to, for example, apply point-specific force on an adjustable lens perimeter. While the depicted embodiments in FIGS. 8-11 may include tangentially mounted benders only, other embodiments may include combinations of tangentially mounted benders, radially mounted benders, and other types of benders, depending on the specific geometry of a lens and desired lens deformations.

In FIG. 8, a tangential bender embodiment 800 may use several discrete actuation points at the tip of each bender, such as bender 810, to drive an asymmetric optical element 820. While the depicted benders may be of unequal lengths, other configurations may include two or more benders of similar lengths and/or benders that apply equal or unequal forces to the perimeter of asymmetric optical element 820.

A cross-section of eyewire edge mounting 900 for a tangential bender embodiment is shown in FIG. 9. A bender 910 may be affixed to an eyewire and interfaced with connection 920 to a deformable optical element 930. Additional benders 940 of various types may also line the periphery of deformable optical element 930.

In general, tangential benders may be made longer than radially mounted benders (for example, to account for eyewire space constraints), which may result in a large deflection, low force design. Shorter couple- beam benders in parallel, like the designs in FIGS. 6 and 7, may be better for low-displacement and high-force applications.

If increased force output is desired, with less compromise in displacement, an embodiment comprising overlapped tangential benders, as shown in configuration 1100 of FIG. 11, may be used to amplify force. As in the FIG. 8 embodiment, overlapped benders 1010, as shown in configuration 1000 of FIG. 10, may apply force and displacement at discrete points along the edge to deform the optical element 1020. In other embodiments, force and displacement may be applied to other areas of the lens to account for asymmetric properties of the lens and/or desired optical power.

In the cross-sectional view of the eyewire frame mounting configuration 1100 depicted in FIG. 11, top 1110 and bottom 1120 overlapping benders may be interfaced to lens element 1130. Benders may be fixed to the bottom plane to deflect the lens edge at connection 1140.

Some direct-drive actuator configurations may provide the benefit of placing a higher level of force on a lens as displacement on the lens increases. FIG. 12A depicts an embodiment in which a bearing 1210 is coupled to a spring 1220 on an upper side of an actuator 1230, and a bearing 1240 is coupled to a spring 1250 on a lower side of actuator 1230 (e.g., a bender). In the state depicted in FIG. 12A, actuator 1230 is in a neutral position, and springs 1220 and 1250 are in a state of maximum stored energy.

Figure 12B:
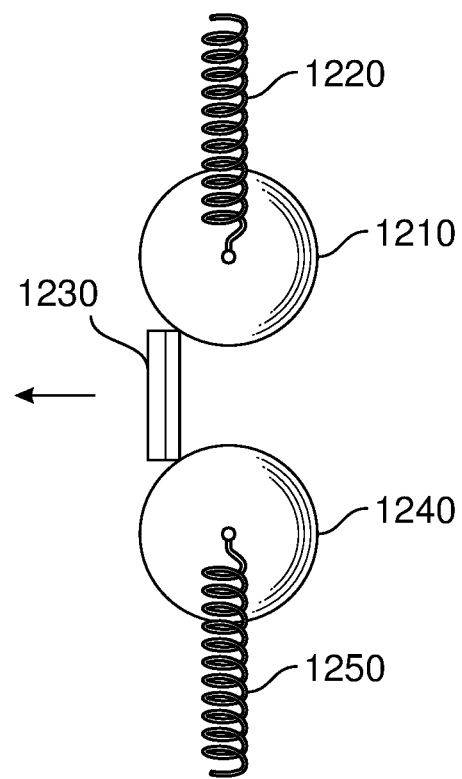

In the second state, shown in FIG. 12B, when actuator 1230 receives applied voltage and bends to deform a lens, springs 1220 and 1250 may extend and release energy (because bearings 1210 and 1240 are under less vertical force from actuator 1230). Consequently, bearings 1210 and 1240 may exert additional lateral force on actuator 1230, in the direction of the lens. An advantage of this configuration may be that it compensates for benders that tend to exert low force near the point of maximum displacement. In other words, bearings 1210 and 1240 may supply additional needed force to fully displace actuator 1230.

More generally, in one or more embodiments, force and/or displacement of one or more actuators may be supplemented via preloading and/or one or more augmentation mechanisms. For example, one or more embodiments may use multiple springs or other configurations known to store mechanical energy (e.g., hydraulic pistons), may use different numbers of bearings (e.g., a single bearing on one side of an actuator) and/or cams, and may use any suitable materials (e.g., steel and various other metals and alloys, various ceramic materials, and/or various plastics) for the components of those configurations. Various types of actuators also may be used, in different positions and/or using various forms of actuation. These embodiments may provide the benefit of placing a higher level of force on a lens as actuator displacement increases. Further examples of augmentation mechanisms that may be used in conjunction with these embodiments are described below with respect to FIGS. 20-27.

FIG. 13 depicts steps of an exemplary method 1300 for assembling a head-worn optical device. At step 1310, one or more actuators may be mounted to an eyewire of a head-worn optical device. The actuators may be mounted to the eyewire of the head-word optical device in any suitable configuration and/or location, as discussed in the disclosure corresponding to FIGS. 7-9. Furthermore, the actuators may be mounted to the eyewire using any suitable coupling mechanism, retaining device, adhesive, etc.

At step 1320, the actuators may be mechanically coupled, in a direct-drive configuration, to a perimeter of a deformable optical element of an asymmetric adjustable lens. The actuators may be mechanically coupled to the optical element in any suitable manner. For example, the eyewire of the head-worn optical device may be dimensioned to hold the asymmetric adjustable lens and actuators in place within a frame of the head-worn optical device. Furthermore, in some embodiments, the actuators may be mechanically coupled to the lens first, and then the assembly of the actuators and the lens may be mounted to the eyewire of the head-worn optical device.

At step 1330, the one or more actuators may be communicatively coupled to a control system programmed to direct the one or more actuators to apply force to the asymmetric adjustable lens to change an optical property of the asymmetric adjustable lens. The actuators may be coupled to the control system by making an electrical connection between the control system and the actuators.

The control system may perform a variety of functions when controlling the actuators, as shown in method 1400 of FIG. 14. At step 1410 in method 1400, a control system may receive an indication of an adjustment to be made to an optical power of an asymmetric adjustable lens. The control system may receive the indication from a user, from a sensor, from another computing system, etc.

In addition to potentially being received from a variety of different sources, the indication of the adjustment may include a variety of types of information. In some embodiments, the indication of the adjustment may include information about an optical correction prescription of a user. Based at least in part on this information, the control system may identify the amount of force for each actuator to apply to the adjustable lens. In some embodiments, the indication of the adjustment may include a cylindrical component, a spherical component, and/or an axial component of an optical correction prescription. In such examples, the control system may identify a plurality of forces to be applied at different locations of the adjustable lens.

The indication of the adjustment may also include information about an interpupillary distance (IPD) between the pupils of a user's eyes. In some examples, the IPD of a user may be detected by an eye-tracking system of a head-mounted display and communicated directly to the control system. Alternatively, an IPD measurement may be received via user input and/or from a remote computing system.

As another example, the indication of the adjustment may include information about adjustments to an apparent accommodation distance of virtual images needed to match the apparent vergence distance of the virtual images, thereby reducing or eliminating vergence-accommodation conflict, as discussed in greater detail below.

At step 1420, in response to receiving the indication of the adjustment, the control system may control one or more direct drive actuators so that force applied by mechanical action of the one or more direct drive actuators changes one or more optical properties of the asymmetric adjustable lens by applying force to a deformable optical element. As noted above, an amount of force applied by mechanical action of one of the actuators may be different from an amount of force applied by another actuator.

Figure 15:
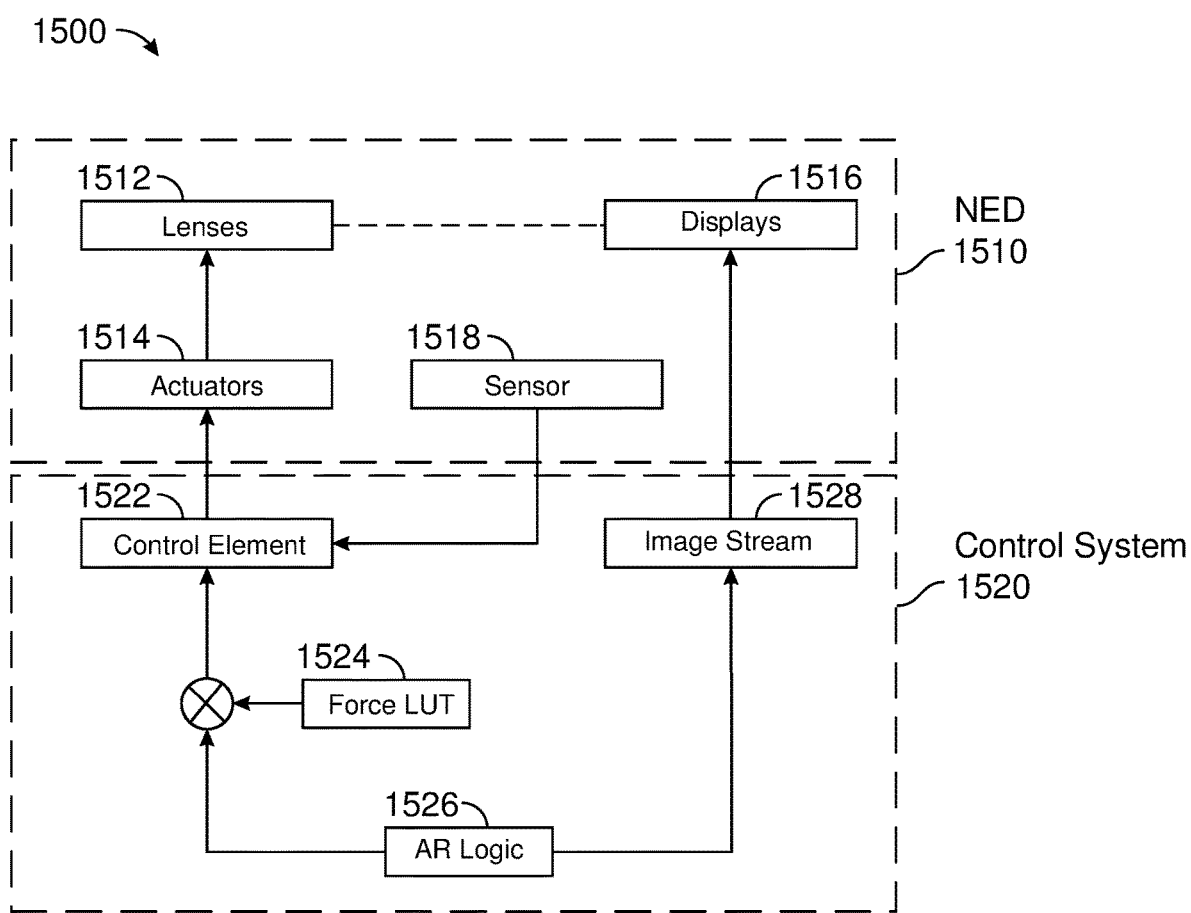
FIG. 15 is a block diagram of exemplary components of an artificial-reality system according to embodiments of this disclosure.

FIG. 15 is a block diagram of a system configured to implement the actuator control functions discussed in method 1400 in FIG. 14. As shown in FIG. 15, a near-eye display system 1500 may include a near-eye display 1510 and a control system 1520, which may be communicatively coupled to each other. The near-eye display 1510 may include lenses 1512, actuators 1514, displays 1516, and a sensor 1518. Control system 1520 may include a control element 1522, a force lookup table 1524, and augmented reality logic 1526.

Augmented reality logic 1526 may determine what virtual objects are to be displayed and real-world positions onto which the virtual objects are to be projected (see FIG. 17 and related discussion below). Accordingly, augmented reality logic 1526 may generate an image stream 1528 that is displayed by displays 1516 in such a way that alignment of right- and left-side images displayed in displays 1516 results in ocular vergence toward a desired real-world position.

Control element 1522 may use the same positioning information determined by augmented reality logic 1526, in combination with force lookup table 1524, to determine an amount of force to be applied by actuators 1514 to lenses 1512. Actuators 1514 may, responsive to control element 1522, apply appropriate forces to lenses 1512 to adjust the apparent accommodation distance of virtual images displayed in displays 1516 to match the apparent vergence distance of the virtual images, thereby reducing or eliminating vergence-accommodation conflict. Control element 1522 may be in communication with sensor 1518, which may measure a state of the asymmetric adjustable lens. Based on data received from sensor 1518, the control element 1522 may adjust actuators 1514 (e.g., as a closed-loop control system).

In some examples, display system 1500 may display multiple virtual objects at once and may determine which virtual object a user is viewing (or is likely to be viewing) to identify a virtual object for which to correct the apparent accommodation distance. For example, the system may include an eye tracking system (not shown) that provides information to control element 1522 to enable control element 1522 to select the position of the relevant virtual object.

Additionally or alternatively, augmented reality logic 1526 may provide information about which virtual object is the most important and/or most likely to draw the attention of the user (e.g., based on spatial or temporal proximity, movement, and/or a semantic importance metric attached to the virtual object). In some examples, the augmented reality logic 1526 may identify multiple potentially important virtual objects and select an apparent accommodation distance that approximates the virtual distance of a group of the potentially important virtual objects.

Control system 1520 may represent any suitable hardware, software, or combination thereof for managing adjustments to adjustable lenses 1512. In some examples, control system 1520 may represent a system on a chip (SOC). As such, one or more portions of control system 1520 may include one or more hardware modules. Additionally or alternatively, one or more portions of control system 1520 may include one or more software modules that perform one or more of the tasks described herein when stored in the memory of a computing device and executed by a hardware processor of the computing device.

Control system 1520 may generally represent any suitable system for providing display data, augmented reality data, and/or augmented reality logic for a head-mounted display. In some examples, control system 1520 may include a graphics processing unit (GPU) and/or any other type of hardware accelerator designed to optimize graphics processing.

Figure 16:
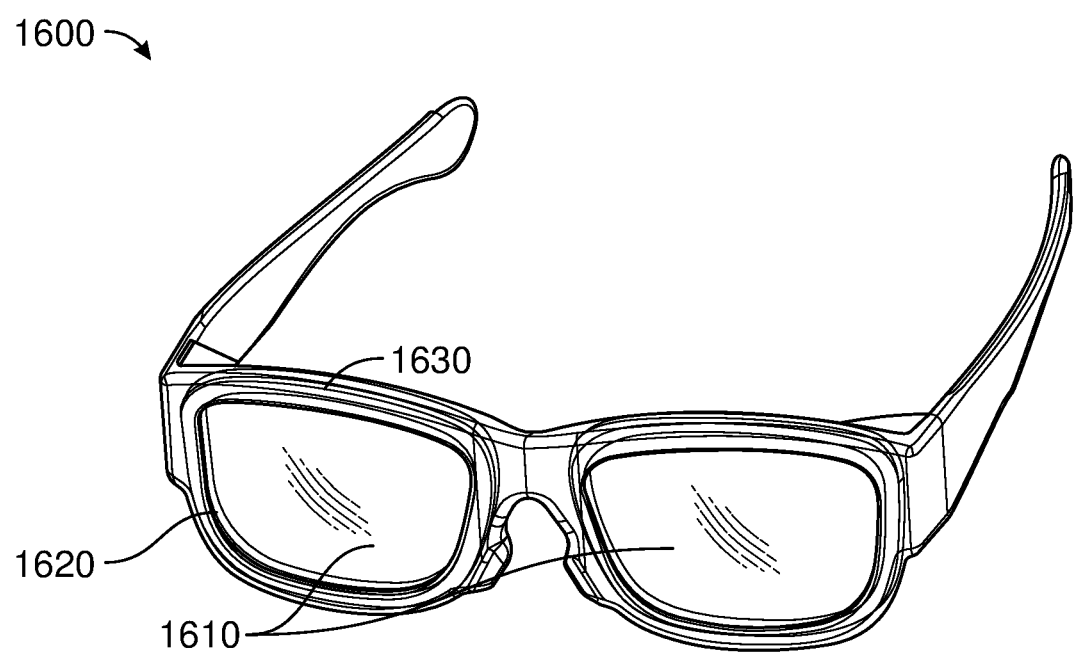
FIG. 16 is a perspective view of a head-worn, artificial-reality system with direct-drive actuators that control adjustable-focus lenses.

Control system 1520 may be implemented in various types of systems, such as the augmented reality glasses 1600 illustrated in FIG. 16. As shown, glasses 1600 may include adjustable-focus lenses 1610 coupled to an eyewire 1620 of a frame 1630. In some embodiments, control system 1520 may be integrated into frame 1630. Alternatively, all or a portion of control system 1520 may be in a system remote from glasses 1600 and configured to control actuators in glasses 1600 via wired or wireless communication.

In an embodiment, each of lenses 1610 may include, for example, an optical fluid encapsulated by an elastomeric membrane and an optically clear and rigid back substrate. Actuation along the perimeter of lenses 1610 may change the curvature (and thus the optical power) of the lenses, with positive and negative shapes determined by the direction of the applied force. In an embodiment, a membrane surface may be non-planar (e.g., concave or convex) at rest (e.g., at zero electrical power). In one example, a membrane surface is non-planar when a substrate is curved.

Actuators mounted in eyewire 1620 may deform each lens, with high optical quality achieved through tailored displacement and deflection, and via perimeter mounting for an asymmetric clear aperture including, for example, an RGB (red-green-blue) waveguide. Such optical components may also be mounted into a glasses frame 1630.

As noted, control system 1520 may trigger actuators to adjust lenses (e.g., lenses 1610) to help address the vergence-accommodation conflict. The vergence-accommodation conflict may result from how humans perceive depth. When a human eye fixates on an object, it accommodates to that object—that is, it changes focal distance to bring that object into focus. That accommodation is a visual cue to depth: objects that are much closer or further away than that distance are out of focus on the retina. This "retinal blur" is a cue that objects are at a different distance than the accommodative distance, although the cue is ambiguous as to whether the objects are closer or more distant.

When both eyes are used (stereoscopically), binocular disparity is the main visual cue for depth. The two eyes look at an object from slightly different angles, so they get slightly different views of the object. This difference in views is the binocular disparity (imperfect match) between the two views. The visual system normally fuses these two images into a single perception and converts the disparity between the two images into a perception of depth. The closer an object is, the larger the disparity (error in matching) between the images it produces on the two retinas.

In a typical virtual reality head-mounted device, a virtual display plane, or focal plane, may be located at a fixed distance. But virtual objects can be "located" either in front of or behind the focal plane. The head-mounted display may try to reproduce binocular disparity for such virtual objects, which is the main visual cue for depth. But the binocular disparity cue may drive the eyes to verge at one distance, while the light rays coming from the virtual plane may produce retinal blur that drives the eyes to accommodate to another distance, creating a conflict between those depth cues and forcing the viewer's brain to unnaturally adapt to conflicting cues. This vergence-accommodation conflict in turn creates visual fatigue, especially during prolonged use of an augmented reality system.

Figure 17:
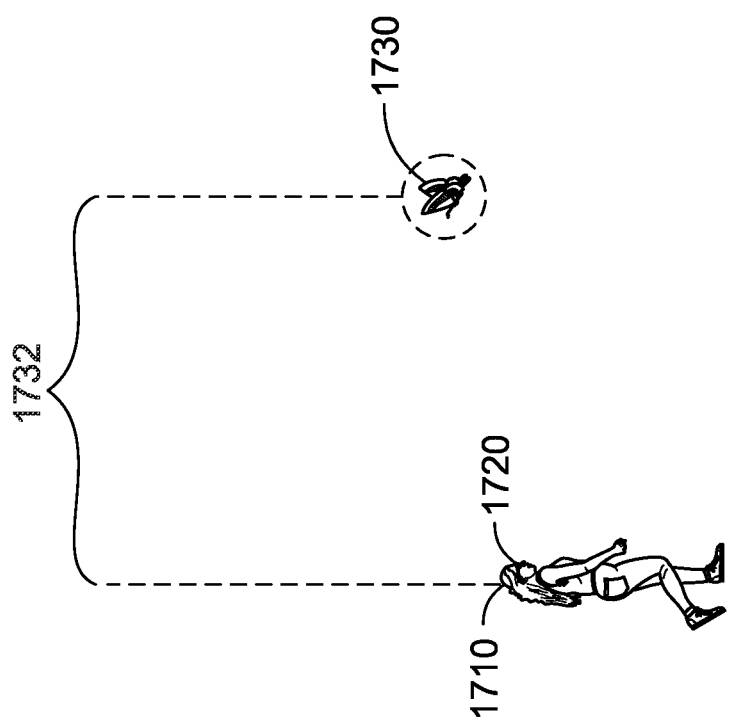
FIG. 17 is an illustration of a user viewing a virtual object within a real-world environment.
Figure 18:
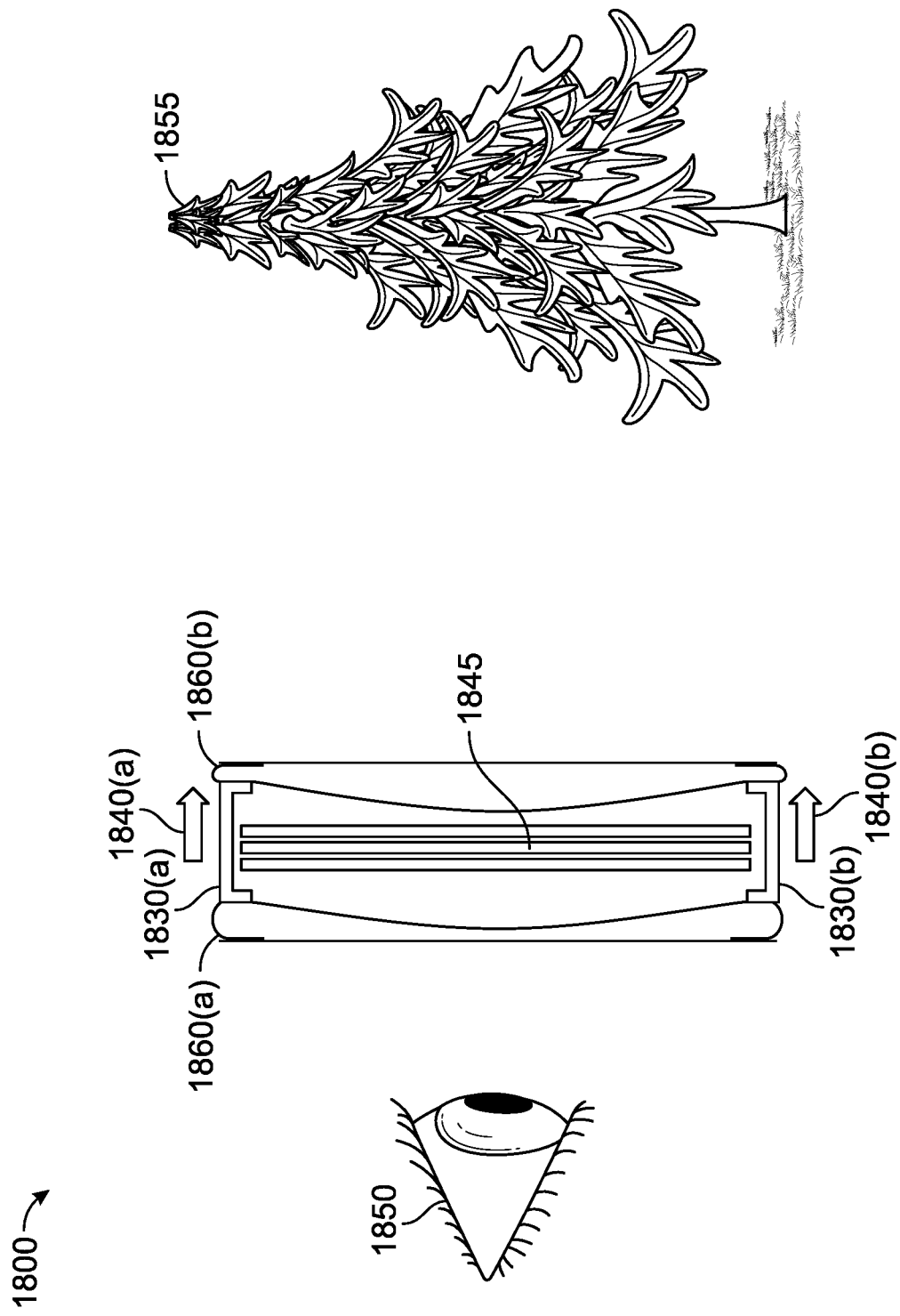
FIG. 18 is a side view of a directly driven lens-display assembly in an adjusted state.
Figure 19:
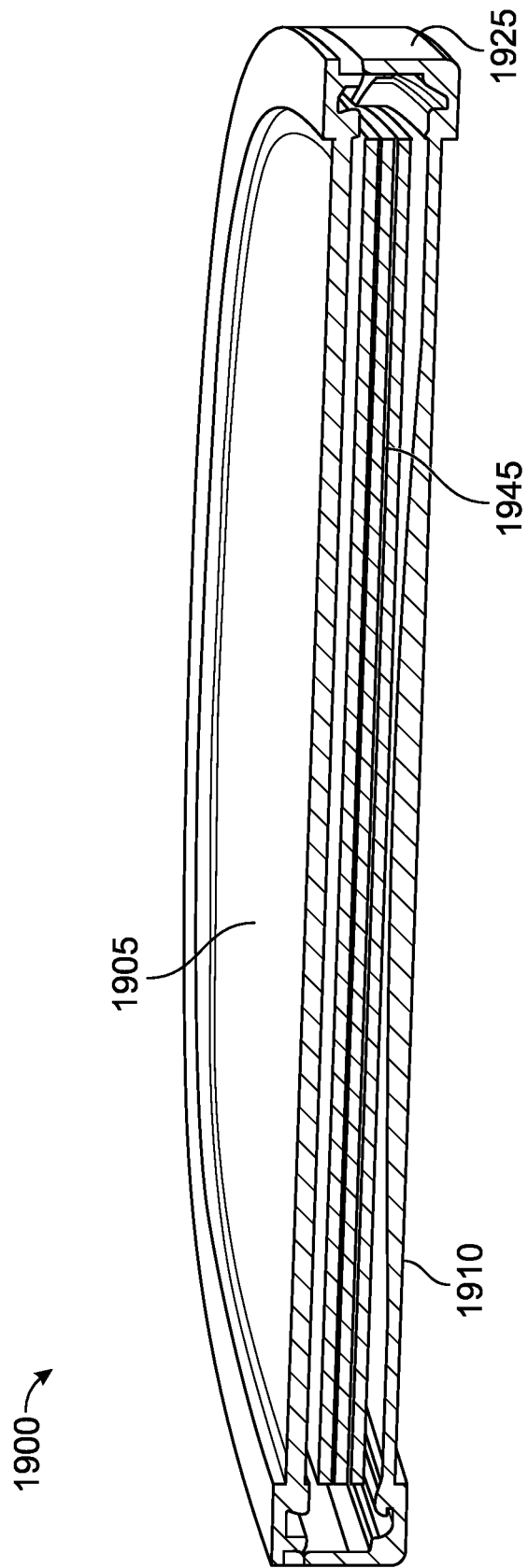
FIG. 19 is a cross-sectional view of a directly-driven lens-display apparatus of an artificial-reality system.

FIGS. 17-19 illustrate an example of how the systems disclosed herein may address the vergence-accommodation conflict. FIG. 17 depicts a user 1710 viewing a virtual object 1730 via an augmented-reality system 1720. Generally, augmented-reality system 1720 may display images to user 1710 such that corresponding virtual objects appear to be located within the real-world environment. For example, although augmented-reality system 1720 may display images representing virtual object 1730 from a position directly in front of the face of user 1710 (e.g., a few centimeters from her eyes), augmented-reality system 1720 may position images for virtual object 1730 such that a left-side and a right-side image of virtual object 1730 align when user 1710 converges her eyes at a point in the real-world environment at a distance 1732 from user 1710. Thus, virtual object 1730 may appear to user 1710 to be at distance 1732 from user 1710.

Because the apparent vergence distance of virtual object 1730 may be at distance 1732 (e.g., several meters away from user 1710) and because augmented-reality system 1720 may display images much closer to the face of user 1710 (e.g., centimeters away from user 1710) to portray virtual object 1730, augmented-reality system 1720 may, absent any correction, cause user 1710 to experience a vergence-accommodation conflict. As a consequence, user 1710 may perceive virtual object 1730 as less realistic or as being out of place. Additionally, or alternatively, user 1710 may experience discomfort associated with the vergence-accommodation conflict, such as nausea, headaches, or eye strain.

In some examples, as will be explained in greater detail below, an adjustable-focus lens set between user 1710 and the augmented-reality display may alter the apparent accommodation distance of virtual object 1730, thereby reducing and/or eliminating vergence-accommodation conflict as virtual object 1730 moves closer or further from user 1710.

Thus, the direct-drive mechanisms disclosed herein may enable user 1710 to see virtual object 1730 clearly, as a seamless part of the real-world environment, and unambiguously appearing to be at distance 1732. In addition, these direct-drive mechanisms may enable user 1710 to use augmented-reality system 1720 for extended periods without experiencing significant vergence-accommodation conflict and associated symptoms, such as nausea and headaches.

In some examples, an augmented reality system may display a virtual image in the respective see-through displays of each of the pair of lens-display assemblies such that the virtual image appears to be situated in the user's environment according to an apparent focal point determined by a positioning of the virtual image in the respective see-through displays of each of the pair of lens-display assemblies.

FIG. 18 shows a side view of a lens-display assembly 1800. As shown in FIG. 18, lens-display assembly 1800 may include an adjustable-focus lens 1860(*a*) and an adjustable-focus lens 1860(*b*). In addition, lens-display assembly 1800 may include a carriage 1830(*a*) and a carriage 1830(*b*), each of which connect adjustable-focus lens 1860(*a*) to adjustable-focus lens 1860(*b*) (e.g., via respective direct-drive actuators).

Because carriages 1830(*a*) and 1830(*b*) are connected to direct-drive actuators coupled to both adjustable-focus lens 1860(*a*) and adjustable-focus lens 1860(*b*), when carriage 1830(*a*) and/or 1830(*b*) moves, carriage 1830(*a*) and/or 1830(*b*) may apply forces to adjustable-focus lens 1860(*a*) and adjustable focus lens 1860(*b*) simultaneously, thereby deforming and modifying the optical power of adjustable-focus lenses 1860(*a*) and 1860(*b*).

In addition, in some examples, lens-display assembly 1800 may include a display 1845 situated between adjustable-focus lenses 1860(*a*) and 1860(*b*). For example, display 1845 may include an augmented-reality display that is substantially translucent (except for, e.g., virtual objects displayed by display 1845), allowing a user's eye 1850 to see beyond display 1845 to real-world objects such as a tree 1855.

Carriages 1830(*a*) and 1830(*b*) may each apply equal pressure to adjustable-focus lens 1860(*a*) and adjustable focus lens 1860(*b*) (e.g., pressure sufficient to maintain tension within the respective membranes of adjustable-focus lenses 1860(*a*) and 1860(*b*) but not to deform adjustable-focus lenses 1860(*a*) and 1860(*b*)). Accordingly, adjustable-focus lenses 1860(*a*) and 1860(*b*) may be flat and exhibit no substantial optical power. Thus, the apparent accommodation distance of a virtual object displayed by display 1845 may be the actual distance of display 1845 from the user's eye 1850. Likewise, lens-display assembly 1800 may not significantly change the appearance of tree 1855 to the user's eye 1850.

In some examples, one or more of the carriages described herein may be rigid. Additionally or alternatively, one or more of the carriages described herein may have a degree of elasticity in one or more directions. In some examples, the length of the carriages may be fixed. In some examples, the length of the carriages may be adjustable. For example, the length of a carriage may be manually adjustable by using, e.g., a set screw or an adjustable threaded shaft. Additionally or alternatively, the length of the carriage may be dynamically adjustable through the use of, e.g., a piezoelectric stack.

FIG. 18 depicts lens-display assembly 1800 in an adjusted state. As shown in FIG. 18, carriages 1830(*a*) and 1830(*b*) may move away from the user's eye 1850 and adjustable-focus lens 1860(*a*), and toward adjustable-focus lens 1860(*b*). In the process, forces 1840(*a*) and 1840(*b*) applied by carriages 1830(*a*) and 1830(*b*), respectively, may shape adjustable-focus lens 1860(*a*) into a plano-concave lens, and shape adjustable-focus lens 1860(*b*) into a plano-convex lens. Adjustable-focus lens 1860(*a*) may thereby cause an image displayed by display 1845 to appear closer to eye 1850. At the same time, adjustable-focus lens 1860(*b*) may compensate for the optical power created by adjustable-focus lens 1860(*a*) so that the appearance of tree 1855 is not significantly affected by the change to adjustable-focus lens 1860(*a*).

As should be appreciated, in some examples intermediate positions of carriages 1830(*a*) and 1830(*b*) may result in intermediate changes to the apparent accommodation distance of images displayed by display 1845, allowing for a continuous range of possible apparent accommodation distances for virtual objects while maintaining the fidelity of the appearance of real-world objects.

FIG. 19 illustrates a cross-section of a lens-display assembly 1900. As shown in FIG. 19, lens-display assembly 1900 may include an adjustable lens 1905, an adjustable lens 1910, a display 1945 positioned between adjustable lenses 1905 and 1910, and a lens assembly housing 1925. In some examples, the volume between lens assembly housing 1925 and display 1945 may provide space for direct drive actuators. According to some examples, the combination of adjustable lenses 1905 and 1910 may modify the apparent accommodation distance of images created by display 1945 without changing the appearance of distant real-world objects as perceived by a user's eye.

The direct-drive actuators discussed herein may be implemented as primary actuators, and the force applied by these actuators may be augmented by secondary actuation mechanisms. For some liquid lenses, the force needed to sufficiently modify the lens shape may be relatively high, which may involve the use of a relatively large and heavy electromechanical actuator. As discussed, actuator weight can add to user discomfort in AR and VR applications, and to address this potential issue some embodiments may include a secondary compensation mechanism that augments force or displacement imposed by the primary actuator, thereby enabling the use of a smaller and lighter-weight primary actuator. As a primary actuator (e.g., one of the benders discussed herein) applies force to a deformable element, the secondary compensation mechanism may react by using spring or magnetic forces to augment the primary force and movement. In some embodiments, secondary augmentation mechanisms may be used to provide for non-linear force augmentation to control lens deformation, as desired. Secondary compensation mechanisms may include spring elements, rotating cam systems, shuttle mechanisms, and magnetic systems in various configurations and combinations. FIGS. 20-27 illustrate various examples of spring-loaded and magnetic augmentation mechanisms.

Figure 21:
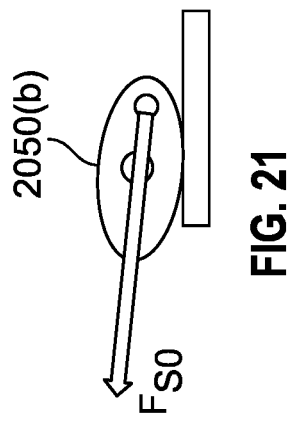
FIGS. 20-27 depict examples of mechanisms for augmenting the force applied by direct-drive actuators.
Figure 20:
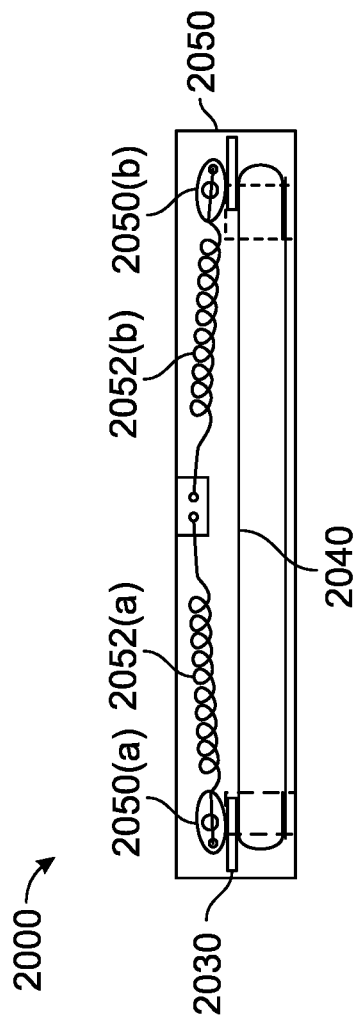

FIGS. 20 and 21 show an embodiment of a deformable lens assembly 2000 have a deformable element 2040 in a non-activated state with rotating cams 2050(*a*) and 2050(*b*) for augmenting displacement of a force distributor ring 2030 resulting from actuation of a primary actuator (e.g., a primary electromechanical actuator). In a neutral state, cams 2050(*a*) and 2050(*b*) may be aligned with springs 2052(*a*) and 2052(*b*), respectively, and a resulting spring force $F_{S0}$ may be aligned with respective pivots of cams 2050(*a*) and 2050(*b*) so that substantially no torque acts on cams 2050(*a*) and 2050(*b*), shown in FIG. 21. Springs 2052(*a*) and 2052(*b*) may initially be in a stretched condition between an outer portion of cams 2050(*a*) and 2050(*b*) and spring attachment structure of a housing. The state illustrated in FIGS. 20 and 21, with springs 2052(*a*) and 2052(*b*) aligned with the respective pivots of cams 2050(*a*) and 2050(*b*), may correspond to a loaded state of cams 2050(*a*) and 2050(*b*).

Figure 23:
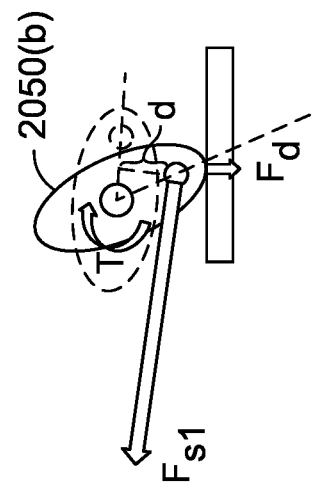
Figure 22:
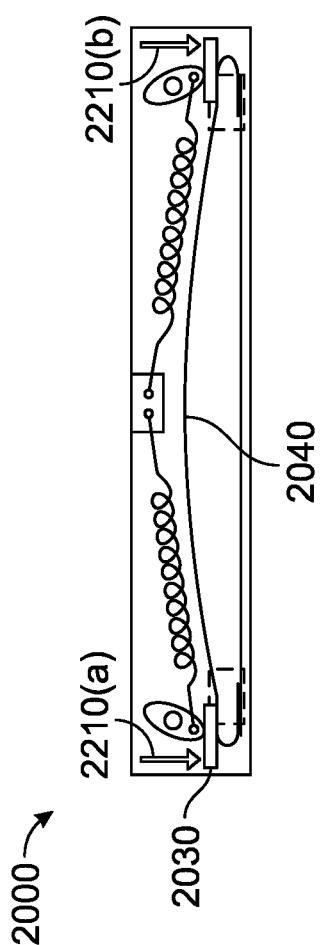

FIGS. 22 and 23 illustrate an embodiment of a deformable lens assembly 2000 in an activated state. Referring to FIGS. 22 and 23, as the primary actuator displaces the force distributor ring 2030 via one or more forces 2210(*a*) and 2210(*b*), cams 2050(*a*) and 2050(*b*) may rotate, creating a moment arm d (FIG. 23) between the spring attachment structure and the pivot of cams 2050(*a*) and 2050(*b*). The spring force $F_{S1}$ may act on the moment arm d, which may result in an application of a torque T (FIG. 23) to cams 2050(*a*) and 2050(*b*). The torque T on the cams 2050(*a*) and 2050(*b*) may result in an application of an augmentation force $F_d$ (FIG. 23) on force distributor ring 2030. The larger the displacement of force distributor ring 2030, the longer the resulting moment arm d in cams 2050(*a*) and 2050(*b*) may be, which, in turn, may increase the augmentation force $F_d$ applied to the force distributor ring 2030. There may be some drop in the resulting spring force $F_{S1}$ (compared to the initial spring force $F_{S0}$) as the stretched length of the springs 2052(*a*) and 2052(*b*) drops during activation, but the increasing moment arm d may compensate for the lower resulting spring force $F_{S1}$ so that the overall force $F_d$ applied by cams 2050(*a*) and 2050(*b*) may increase with an increasing stroke of force distributor ring 2030.

Figure 25:
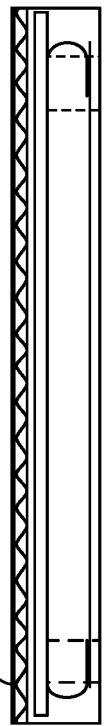
Figure 27:
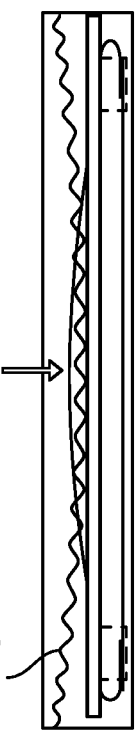
Figure 24:
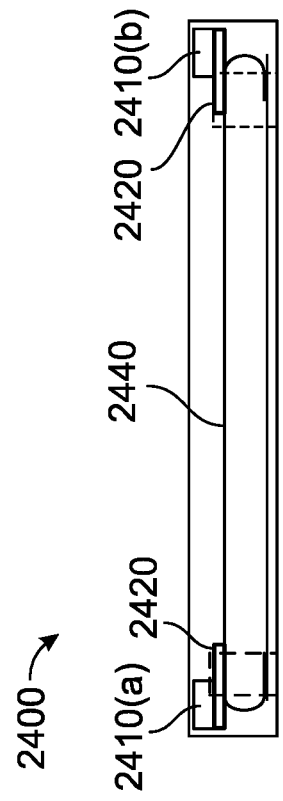
Figure 26:
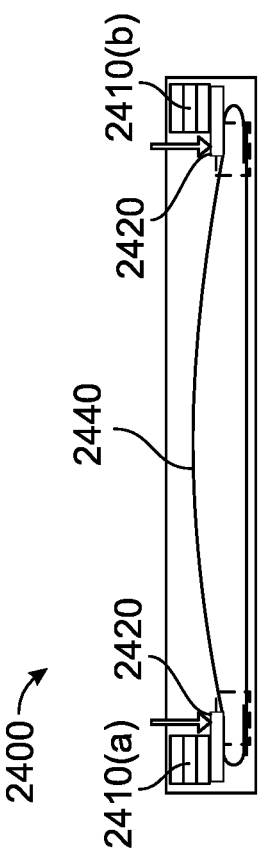

FIGS. 24-27 illustrate an embodiment of deformable lens assembly 2400 in resting states (FIGS. 24 and 25) and activated states (FIGS. 26 and 27). FIGS. 24 and 25 illustrate deformable lens assembly 2400 in a neutral (non-activated) state from an end view and a side view, respectively. FIGS. 26 and 27 illustrate deformable lens assembly 2400 in an activated state from an end view and a side view, respectively. Deformable lens assembly 2400 may include buckling spring elements 2410(*a*) and 2410(*b*) configured to buckle to augment a displacement of a force distribution ring 2420 resulting from actuation of a primary actuator. Buckling spring elements 2410(*a*) and 2410(*b*) may initially be in a compressed state along their length, prior to actuation of the primary actuator (e.g., in the position shown in FIGS. 24 and 25). Such compression may be a result of selecting buckling spring elements 2410(*a*) and 2410(*b*) to have uncompressed lengths that are smaller than respective lengths of the spaces in which buckling spring elements 2410(*a*) and 2410(*b*) are housed.

During activation of the deformable lens assemblies 2400 by a primary force from a primary actuator, the buckling spring elements 2410(*a*) and 2410(*b*) may act on the force distributor ring 2420 to augment the primary force on a deformable element 2440. The buckling spring elements 2410(*a*) and 2410(*b*) may be selected such that their elastic section moduli (a geometric parameter) and Young's modulus of elasticity (a material property) result in elastic buckling of the buckling spring elements 2410(*a*) and 2410(*b*) in at least one plane when unconstrained from the sides. As the primary actuator displaces the force distributor ring 2420 with the primary force, the buckling spring elements 2410(*a*) and 2410(*b*) may continue to buckle with an increasing force toward an equilibrium condition, thereby applying an increasing augment force on the force distributor ring 2420 to augment displacement of the force distributor ring 2420 resulting from actuation of the primary actuator.

The deformable optical elements discussed herein may be formed in any suitable way, including traditional formation methods. However, in some embodiments the deformable optical elements may be ultra-thin liquid lenses (e.g., with less than 1 mm thickness), but such lenses may be too thin for traditional manufacturing methods, which may involve admitting an injection component from the side. In some embodiments, by filling an ultra-thin liquid lens from the back of the lens (e.g., through or along the side of an optically transparent backplane that forms the back of the fluid cavity), the thinness of the ultra-thin liquid lens may not pose a limitation. In one example, a liquid lens membrane and a backplane may be positioned within a fluid reservoir such that a small gap between the edge of the backplane and the lens membrane admits pressurized fluid into the fluid cavity. In this example, a one-way valve may allow air to escape as the fluid cavity fills, and once the fluid cavity is full, pressure may be applied to the lens membrane at the gap to form a seal between the membrane and the side of the backplane.

The one-way valve may then be replaced with a force distributor to plug the hole left by the valve. In another example, a needle with a point of low compressive strength may be placed between the side of the backplane and the lens membrane, and the lens membrane may be sealed to the backplane around the needle. After the needle injects fluid into the fluid cavity, pressure may be applied to the needle at the point of low compressive strength to break off the tip of the needle, allowing the lens membrane to be sealed to the side of the backplane where the needle once was. In some examples, fluid may be injected into the fluid cavity through a hole in the backplane. The hole in the backplane may then be sealed. However, the hole in the backplane may be positioned behind an existing obstruction (e.g., a force distributor) such that the sealant may not provide any additional optical obstruction. Alternatively, an optically transparent sealant may be used to fill the hole.

In addition to being formed in a variety of ways, the deformable lenses discussed herein may be coated with various types of coatings. For example, since unwanted reflections within an optical system may degrade image quality through loss of light and reduced contrast, anti-reflection treatments to optical elements may reduce unwanted reflection. However, anti-reflection treatments that are suitable for non-deforming optical elements may be less suitable for deformable optical elements, such as liquid lenses. For example, typical anti-reflection coatings applied to a liquid lens may not normally be capable of withstanding the repeated strain caused by the deformation of the surface of the liquid lens during operation or fabrication.

By applying an anti-reflective coating with a low elastic modulus, the anti-reflective coating may withstand repeated strain. Multiple layers of coating may be applied, alternating between coating materials of higher and lower refractive index, result in an anti-reflective multilayer interference coating. For example, a liquid lens film may be placed in a chamber. A precursor monomer may be introduced into the chamber, and a reaction may be initiated to apply a corresponding polymer layer onto the liquid lens film. A different precursor monomer may later be introduced into the chamber, and a reaction may be initiated to apply a different polymer layer on top of the first layer. The process may repeat until the multilayer coating has completed. In one example, the reaction may be accomplished by introducing an initiator material into the chamber with the precursor monomer and then generating heat within the chamber to activate the initiator material (i.e., an initiated chemical vapor deposition process). In another example, the reaction may be accomplished by directing actinic energy against the surface of the liquid lens film (i.e., a thermal evaporation coating process). In one example, a roll of liquid lens film may be progressively fed into the chamber to create a roll of anti-reflected liquid lens film.

In another example, the deformable optical elements disclosed herein may be coated with a variable thickness coating. Since molding or extruding materials that are appropriate for liquid lens membranes may be difficult or impossible to use to form a variable thickness deformable element, embodiments of the instant disclosure may coat a deformable optical element with a variable thickness coating that may achieve one or more of the benefits of variable thickness membranes. Methods for forming such variable thickness coatings are disclosed, including inkjet printing or spin coating a variable thickness coating on the deformable optical element. Various methods for curing coatings are also disclosed.

Some embodiments of the instant disclosure may use liquid lenses with improved response times of deformable optical elements. When a deforming force is applied to a liquid lens, the liquid within the liquid lens may become perturbed, and the shape of the liquid lens may not reach its equilibrium form, with the desired optical properties, until the perturbation dissipates. The thinner the lens (or the stronger the applied deforming force) the higher the velocity of the liquid. A higher velocity and/or a higher viscosity of the liquid may cause a longer response time. Furthermore, lower environmental temperatures may raise the viscosity of the liquid, further exacerbating response times, especially for thin lenses. Therefore, to achieve a thin liquid lens with a high response time, a liquid lens adjustment system may detect the temperature and adjust the deforming force applied to the liquid lens accordingly. For example, at lower temperatures, the liquid lens adjustment system may reduce the speed of a driver that applies the deforming force to the liquid lens, thereby compensating for increased viscosity with reduced velocity and preventing a significant increase in response time that may otherwise be caused by the lower temperature.

Some embodiments may also combine certain features within an optical system to minimize space and utilize aspects of one feature to support one another. For example, in some optical systems, an accommodative lens may be supported by an optical substrate. The optical substrate may be a corrective lens, such as a prescription lens. A selectively reflective surface may be included in the optical substrate so that it reflects a subset of light (e.g., specific wavelengths or light having a specific polarization state) received from the scene and reflected off the user's eye toward an eye-tracking camera included in a head-worn display system. The reflective surface may be provided by a hot mirror filter and/or a Fresnel lens and may reflect IR light toward the eye-tracking camera. In some instances, the eye-tracking camera (or cameras for left and right eyes) may be used to estimate a depth of a plane at which the user's eyes are focused. This depth information may be used to activate an adjustable lens so that the depth of focus of the optical system corresponds to the user's gaze (e.g., as an alternative to bifocal eyewear). Embodiments of such an optical system can also be utilized in a variety of other applications, such as in surgical loupes.

Various embodiments may also involve pre-straining deformable optical elements for use in the optical assemblies disclosed herein. Preformed deformable elements for adjustable lenses may counteract problems of gravity sag, provide for specific user optical properties (e.g., astigmatism, interpupillary distances, etc.), and correct for optical aberrations, for example. The preformed optical elements may have a variable mechanical stress and/or strain profile, with different strains in a central region compared to an edge region. Additionally, adjustable lenses with variable strain profiles may make upward activation (e.g., to form a concave lens shape) and a downward activation (e.g., to form a convex lens shape) more closely matched in force requirements. Various methods may be implemented for forming such preformed optical elements with variable strain profiles, including thermoforming, applying a variable heat profile to induce residual stress, and stretching.

In some embodiments, a compliant edge seal for liquid lenses may help alleviate issues with differential thermal expansion between a backplane and a corresponding deformable optical element, as well as issues resulting from pre-tensioning elastic deformable optical elements. Conventional liquid lenses may include a deformable optical element that is directly coupled/adhered to a backplane, and the issues of gravity sag and pre-tensioning may generally result in a limited selection of available materials for forming conventional liquid lenses. Providing a compliant material as an edge seal (or as the entire deformable medium) between the backplane and the deformable optical element may enable a wider selection of materials for the deformable optical element by alleviating issues of gravity sag and pre-tensioning. The compliant material may be a material with an intermediate coefficient of thermal expansion between that of the backplane and deformable optical element. In order to maintain boundary conditions for the deformable optical element, some embodiments may include compliant material with anisotropic material properties, such as to allow for vertical expansion and compression while keeping lateral movement low. Such anisotropy may be achieved with hyperelastic and/or composite materials (e.g., glass or carbon fibers in a polymer material).

As detailed above, the devices and systems described and/or illustrated herein broadly represent any type or form of device or system capable of providing the described functionality.

In some examples, the term "memory device" generally refers to any type or form of volatile or non-volatile storage device or medium capable of storing data and/or computer-readable instructions. In one example, a memory device may store, load, and/or maintain one or more of the modules described herein. Examples of memory devices include, without limitation, Random Access Memory (RAM), Read Only Memory (ROM), flash memory, Hard Disk Drives (HDDs), Solid-State Drives (SSDs), optical disk drives, caches, variations or combinations of one or more of the same, or any other suitable storage memory.

In some examples, the term "physical processor" generally refers to any type or form of hardware-implemented processing unit capable of interpreting and/or executing computer-readable instructions. In one example, a physical processor may access and/or modify one or more modules stored in the above-described memory device. Examples of physical processors include, without limitation, microprocessors, microcontrollers, Central Processing Units (CPUs), Field-Programmable Gate Arrays (FPGAs) that implement softcore processors, Application-Specific Integrated Circuits (ASICs), portions of one or more of the same, variations or combinations of one or more of the same, or any other suitable physical processor.

Although illustrated as separate elements, the devices described and/or illustrated herein may represent portions of a single module or application. In addition, in certain embodiments one or more of these modules may represent one or more software applications or programs that, when executed by a computing device, may cause the computing device to perform one or more tasks. For example, one or more of the modules described and/or illustrated herein may represent modules stored and configured to run on one or more of the computing devices or systems described and/or illustrated herein. One or more of these modules may also represent all or portions of one or more special-purpose computers configured to perform one or more tasks.

In addition, one or more of the modules described herein may transform data, physical devices, and/or representations of physical devices from one form to another. For example, one or more of the modules recited herein may receive encoder or position sensor data to be transformed, transform the received data, output and/or use a result of the transformation to perform a function (such as actuation), and store the result of the transformation to perform a function. Additionally or alternatively, one or more of the modules recited herein may transform a processor, volatile memory, non-volatile memory, and/or any other portion of a physical computing device from one form to another by executing on the computing device, storing data on the computing device, and/or otherwise interacting with the computing device.

In some embodiments, the term "computer-readable medium" generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

Embodiments of the instant disclosure may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

What is claimed is:

1. An apparatus, comprising:
   an adjustable lens assembly, comprising:
      a first adjustable lens comprising a first deformable optical element;
      a second adjustable lens comprising a second deformable optical element;
      a first actuator coupled to the first deformable optical element such that mechanical action of the first actuator applies a force to the first deformable optical element; and
      a second actuator coupled to the second deformable optical element such that mechanical action of the second actuator applies a force to the second deformable optical element;
   a display element situated between the first adjustable lens and the second adjustable lens;
   a sensor positioned to measure a state of at least one of the first or second adjustable lens; and
   a controller configured to actuate at least one of the first or second actuators via closed-loop control based on data received from the sensor.

2. The apparatus of claim 1, wherein the first adjustable lens comprises a first asymmetric adjustable lens and the second adjustable lens comprises a second asymmetric adjustable lens.

3. The apparatus of claim 1, wherein:
   at least one of the first or second actuators is radially mounted along a perimeter of the respective deformable optical element, and
   the force applied by the at least one of the first or second actuators acts on a perimeter of the respective deformable optical element.

4. The apparatus of claim 3, wherein the at least one of the first or second actuators is positioned to apply force at a discrete point on the perimeter of the respective deformable optical element.

5. The apparatus of claim 1, wherein at least one of the first or second actuators comprises an electrically driven actuator, wherein the controller is further configured to actuate the electrically driven actuator via current control, voltage control, or hybrid current-voltage control.

6. The apparatus of claim 5, further comprising an electrical power source coupled to the electrically driven actuator.

7. The apparatus of claim 1, wherein the controller is configured to actuate the at least one of the first or second actuators in response to user input.

8. The apparatus of claim 1, wherein the sensor is configured to sense whether the at least one of the first or second adjustable lenses is in an adjusted state or a non-adjusted state.

9. An apparatus, comprising:
   an adjustable lens assembly, comprising:
      a first adjustable lens comprising a first deformable optical element;
      a second adjustable lens comprising a second deformable optical element;

a first actuator tangentially mounted along a perimeter of the first deformable optical element such that mechanical action of the first actuator applies a force to the first deformable optical element at a discrete point on the perimeter of the first deformable optical element; and a second actuator tangentially mounted along a perimeter of the second deformable optical element such that mechanical action of the second actuator applies a force to the second deformable optical element at a discrete point on the perimeter of the second deformable optical element; and a display situated between the first adjustable lens and the second adjustable lens.

10. The apparatus of claim 9, wherein at least one of the first or second actuators comprises at least one of an electroactive bender, an electroactive stack, a piezoelectric bender, a piezoelectric stack, an electrostrictive bender, or an electrostrictive stack.

11. The apparatus of claim 9, wherein at least one of the first or second actuators comprises an electroactive material including at least one of lead zirconium titanate, barium titanate, or single crystals including lead magnesium niobite-lead titanate or lead zirconate niobate-lead titanate.

12. The apparatus of claim 9, wherein at least the first actuator comprises an electroactive bender, wherein an end of the electroactive bender is positioned to apply the force to the first deformable optical element at the discrete point on the perimeter of the first deformable optical element.

13. The apparatus of claim 9, further comprising an augmentation mechanism configured to supplement the force applied by at least one of the first actuator or the second actuator.

14. The apparatus of claim 9, wherein at least one of the first actuator or the second actuator is preloaded.

15. The apparatus of claim 9, wherein the first actuator and the second actuator are configured to apply a different amount of force to the respective deformable optical elements.

16. A method comprising:
receiving an indication of an adjustment to be made to an optical property of a first deformable optical element positioned between a see-through display and a user's eye;

receiving an indication of an adjustment to be made to an optical property of a second deformable optical element positioned on an opposite side of the see-through display from the first deformable optical element; and in response to receiving the indications of the adjustments, applying a first force to the first deformable optical element with a first actuator and applying a second force to the second deformable optical element with a second actuator, wherein the indication of the adjustment to be made to the optical property of at least one of the first deformable optical element or the second deformable optical element is based on user input.

17. The method of claim 16, further comprising sensing, with a sensor, a state of at least one of the first deformable optical element or the second deformable optical element.

18. The method of claim 16, wherein applying the first force to the first deformable optical element comprises applying the first force to at least one discrete point along a perimeter of the first deformable optical element.

19. The method of claim 16, wherein applying the second force to the second deformable optical element comprises applying the second force to at least one discrete point along a perimeter of the second deformable optical element.

20. The method of claim 16, further comprising supplementing at least one of the first force or the second force with an augmentation mechanism.

* * * * *